United States Patent
Matsunami et al.

(10) Patent No.: US 7,935,962 B2
(45) Date of Patent: May 3, 2011

(54) ORGANIC ELECTROLUMINESCENT DEVICE AND DISPLAY UNIT

(75) Inventors: Shigeyuki Matsunami, Kanagawa (JP); Yasunori Kijima, Tokyo (JP); Tomoyuki Higo, Tokyo (JP)

(73) Assignee: Sony Corporation, Tokyo (JP)

( * ) Notice: Subject to any disclaimer, the term of this patent is extended or adjusted under 35 U.S.C. 154(b) by 166 days.

(21) Appl. No.: 12/466,751

(22) Filed: May 15, 2009

(65) Prior Publication Data
US 2009/0294763 A1 Dec. 3, 2009

(30) Foreign Application Priority Data
May 16, 2008 (JP) .................................. 2008-129592

(51) Int. Cl.
*H01L 35/24* (2006.01)
(52) U.S. Cl. .................. 257/40; 257/103; 257/E51.028; 257/E51.026; 257/E51.027; 549/59
(58) Field of Classification Search .................... 257/40, 257/103, E51.028, E51.026, E51.027; 549/59
See application file for complete search history.

(56) References Cited

U.S. PATENT DOCUMENTS
6,875,524 B2 * 4/2005 Hatwar et al. ................ 428/690

FOREIGN PATENT DOCUMENTS
| JP | 2002-093583 A | 3/2002 |
| JP | 2004-047469 A | 2/2004 |
| JP | 2004-134396 A | 4/2004 |
| JP | 2007-503092 T | 2/2007 |
| WO | 2005/020283 A2 | 3/2005 |

OTHER PUBLICATIONS

Aziz, Hany et al., "Degradation Mechanism of Small Molecule-Based Organic Light-Emitting Devices", Science, 283:1900-1902, Mar. 19, 1999.

(Continued)

*Primary Examiner* — Tu-Tu V Ho
(74) *Attorney, Agent, or Firm* — SNR Denton US LLP

(57) ABSTRACT

Disclosed herein is an organic electroluminescent device including: an anode; a cathode; and an organic layer including a light-emitting layer, a naphthacene compound layer containing a naphthacene compound, and an electron transport layer; the light-emitting layer being composed of a light-emitting guest material and an aromatic hydrocarbon compound having the skeleton of anthracene, and the naphthacene compound layer containing no less than 80 wt % of naphthacene compound represented by the formula (1) below and having a thickness of 0.5 to 10 nm and being in contact with that side of the electron transport layer which faces the light-emitting layer.

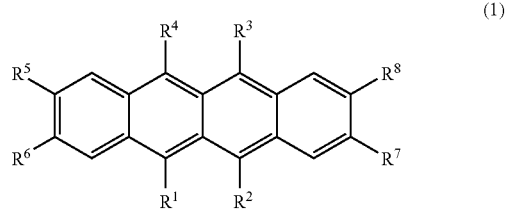

(1)

12 Claims, 3 Drawing Sheets

OTHER PUBLICATIONS

Aziz, Hany & Popovic, Zoran D., "Study of organic light emitting devices with a 5, 6, 11, 12-tetraphenylnaphthacene (rubrene)-doped hole transport layer", Applied Physics Letters, 80(12):2180-2182, Mar. 25, 2002. Huang, Jinsong et al., "Improving the power efficiency of white light-emitting diode by doping electron transport material", Applied Physics Letters, 89, 133509, Sep. 27, 2006.
Li, G. & Shinar, J., "Combinatorial fabrication and studies of bright white organic light-emitting devices based on emission from rubrene-doped 4,4'-bis(2,2'-diphenylvinyl)-1,1'-biphenyl", Applied Physics Letters, 83(26):5359-5361, Dec. 29, 2003.
Popovic, Z.D. et al., "Life extension of organic LED's by doping of a hole transport layer", Thin Solid Films, 363:6-8, 2000.
Tsai, Yung-Cheng, "Long-lifetime, high-efficiency white organic light-emitting diodes with mixed host composing double emission layers", Applied Physics Letters, 89:243521, Dec. 15, 2006.

* cited by examiner

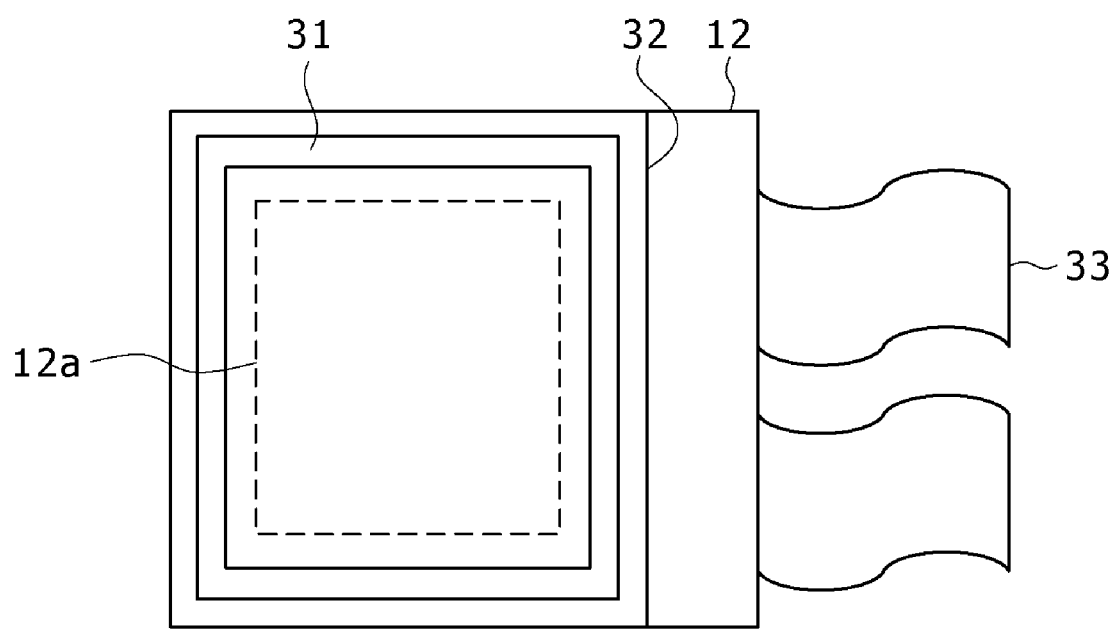

ORGANIC ELECTROLUMINESCENT DEVICE AND DISPLAY UNIT

BACKGROUND OF THE INVENTION

1. Field of the Invention

The present invention relates to an organic electroluminescent device and a display unit. More particularly, the present invention relates to an organic electroluminescent device having a long light-emitting life and also to a display unit provided with such devices.

2. Description of the Related Art

Display units of flat panel type have prevailed recently because of their light weight and high efficiency. Noteworthy among them is one which is provided with organic electroluminescent devices (so-called organic EL devices).

The organic electroluminescent device is formed on a transparent substrate such as a glass plate. The device proper includes an anode and a cathode and an organic layer held between these electrodes. The anode adjacent to the substrate is formed from transparent ITO (indium tin oxide). The organic layer is composed of a hole injection layer, a hole transport layer, an electron transport layer, and a light-emitting layer, which are placed one over another. The cathode is formed on the top. This structure may be modified such that an additional electron transport layer is placed on the light-emitting layer. The organic electroluminescent device constructed as mentioned above works in such a way that the light-emitting layer causes recombination to occur between electrons injected from the cathode and holes injected from the anode and recombination emanates light through the anode and substrate.

There is another organic electroluminescent device differing in structure from the foregoing one. It is composed of a substrate, a cathode, an organic layer, and an anode, which are sequentially arranged upward. The top electrode (anode or cathode) may be formed from a transparent material so that light emanates from the top electrode opposite to the substrate. The device of top-emission type is desirable for the display unit of active matrix type, which is composed of a substrate and thin-film transistors (TFT) arranged thereon, because of its large open area ratio.

For the organic electroluminescent display unit to be of practical use, the organic electroluminescent device should have a large open area for efficient light emission as well as a reliable long life.

There are several factors detrimental to life. Noteworthy among them is deterioration of the electron transport layer which is usually made of $Alq_3$ (8-hydroxyquinoline aluminum). In Science, 1999, vol. 283, pp. 1900-1902, Z. D. Popovic et al. reported that the organic electroluminescent device is deteriorated by hole injection into $Alq_3$ and radicals resulting therefrom, and also proposed a model of deterioration.

Based on the model of deterioration, Z. D. Popovic et al. attempted to suppress hole injection into $Alq_3$ by doping the hole transport layer with a low-molecular weight compound (such as rubrene). This attempt succeeded in a great improvement of emitting life. The result proved the model assuming that the doping layer traps excess holes, thereby preventing $Alq_3$ from forming radicals. See Thin Solid Films, 2000, vol. 363, pp. 6-8.

Moreover, it is reported in Applied Physics Letters, 2002, vol. 80, pp. 2180-2182 that the doped rubrene produces no effect at the interface between the laminated layers (for example, between the metal layer and the organic layer or between the organic layer and the organic layer) but the layer doped with rubrene changes in its bulk properties and traps holes, thereby extending life.

The technology involving rubrene is not limited to the trapping of charges as mentioned above. It is also directed to the organic electroluminescent device that emits white light because rubrene, in the form of simple substance, emits yellow light and hence a combination of rubrene layer and light-emitting layer that emits blue light would produce white light. See JP-A-2002-93583; JP-A-2004-47469; JP-A-2004-134396; JP-T-2007-503092; Science, 1999, vol. 283, pp. 1900-1902; Thin Solid Films, 2000, vol. 363, pp. 6-8; Applied Physics Letters, 2002, vol. 80, pp. 2180-2182; Applied Physics Letters, 2003, vol. 83, p. 5359-5361; Applied Physics Letters, 2006, vol. 89, p. 133509; and Applied Physics Letters, 2006, vol. 89, p. 243521. The organic electroluminescent device with rubrene will produce white light whose purity depends on the ratio between light from the rubrene-doped layer and light from its adjacent light-emitting layer that emits blue light because both layers emit light simultaneously.

SUMMARY OF THE INVENTION

The organic electroluminescent device for industrial use in recent years is constructed such that the organic layer held between the electrodes includes several sublayers each functioning differently. Consequently, the doping with rubrene to form the trapping layer adversely affects the function of the light-emitting layer. In other words, the simple doping with rubrene for hole trapping to protect the light-emitting layer or its adjacent layer against deterioration adversely affects the light-emitting function because rubrene emits light which combines with light from the light-emitting layer itself. Light emitted from the adjacent rubrene layer results in undesirable color mixing unless the doping with rubrene is intended to produce white light. Thus, the resulting EL device does not emit light with a color which the light-emitting layer inherently produces.

The present invention was completed in view of the foregoing. It is desirable to provide an organic electroluminescent device which emits light having an adequate color purity without color mixing and which has a greatly extended life and to provide a display unit provided with such organic electroluminescent devices.

As the result of their intensive investigations, the present inventors found that the above-mentioned problem is solved by interposing between the electron transport layer and the light-emitting layer a layer of specific thickness formed from a naphthacene compound of specific purity. This finding led to the present invention.

The present invention is directed to an organic electroluminescent device which includes an anode, a cathode, and an organic layer held between them which includes a light-emitting layer, a naphthacene compound layer containing a naphthacene compound, and an electron transport layer, the light-emitting layer being composed of a light-emitting guest material and an aromatic hydrocarbon compound having the skeleton of anthracene, and the naphthacene compound layer containing no less than 80 wt % of naphthacene compound represented by the formula (1) below and having a thickness of 0.5 to 10 nm and being in contact with that side of the electron transport layer which faces the light-emitting layer.

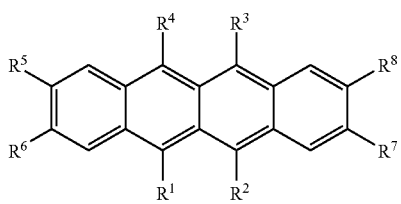

(1)

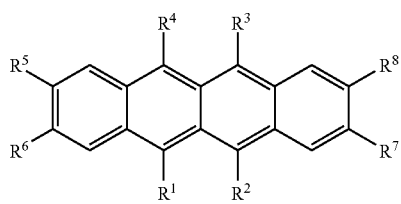

(1)

The organic electroluminescent device according to an embodiment of the present invention has a much longer life than that which does not have the naphthacene compound layer. It also emanates only the light generated by the light-emitting layer without being affected by the naphthacene compound layer.

The display unit according to an embodiment of the present invention is composed basically of a substrate and a plurality of the organic electroluminescent devices arranged thereon.

The display unit according to an embodiment of the present invention produces light with reproducible colors owing to the organic electroluminescent device intended for high brightness and high color purity.

The organic electroluminescent device according to an embodiment of the present invention has a long life and produces light with good color purity.

The display unit according to an embodiment of the present invention has a long life and produces light with good color purity and color reproducibility because it is provided with the organic electroluminescent devices according to an embodiment of the present invention.

BRIEF DESCRIPTION OF THE DRAWINGS

FIG. 3 is a schematic diagram showing the sealed display module applicable to the display unit according to an embodiment of the present invention.

DETAILED DESCRIPTION OF THE PREFERRED EMBODIMENTS

Figure 1:
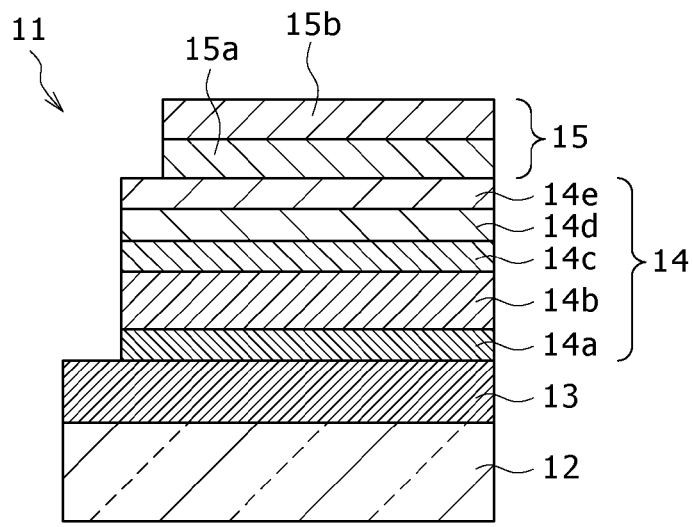
FIG. 1 is a sectional view showing the structure of the organic electroluminescent device according to one embodiment of the present invention.

Described below are the organic electroluminescent device and display unit according to an embodiment of the present invention.

The organic electroluminescent device 11 includes an anode 13 and a cathode 15 and an organic layer 14 held between them. The organic layer 14 includes a light-emitting layer 14c, a naphthacene compound layer 14d, and an electron transport layer 14e. The light-emitting layer 14c is composed of a light-emitting guest material and an aromatic hydrocarbon compound having the skeleton of anthracene. The naphthacene compound layer 14d contains no less than 80 wt % of naphthacene compound represented by the formula (1) below and having a thickness of 0.5 to 10 nm and being in contact with that side of the electron transport layer 14e which faces the light-emitting layer 14c.

In the formula (1), $R^1$ to $R^8$ independently denote a hydrogen atom, halogen atom, hydroxyl group, cyano group, nitro group, any of carbonyl group, carbonyl ester group, alkyl group, alkenyl group, and alkoxyl group, which may be substituted with a group having no more than 20 carbon atoms, and any of silyl group, aryl group, and heterocyclic group, which may be substituted with a group having no more than 30 carbon atoms.

Embodiment of Organic Electroluminescent Device

<Organic Electroluminescent Device>

FIG. 1 is a sectional view showing the structure of the organic electroluminescent device according to one embodiment of the present invention.

The organic electroluminescent device 11 shown in FIG. 1 includes a substrate 12, an anode 13, an organic layer 14, and a cathode 15, which are sequentially placed one over another. The organic layer 14 includes a hole injection layer 14a, a hole transport layer 14b, a light-emitting layer 14c, a naphthacene compound layer 14d, and an electron transport layer 14e, which are sequentially placed one over another on the anode 13.

The organic layer 14 according to the embodiment of the present invention includes the light-emitting layer 14c and the naphthacene compound layer 14d in contact with that side of the electron transport layer 14e which faces the light-emitting layer 14c.

It is assumed that the organic electroluminescent device 11 of laminate structure as mentioned above is that of top emission type which emanates light from the opposite side of the substrate 12. The following is a detailed description of each layer, which starts with the substrate 12.

<Substrate>

The substrate 12 is a support on one surface of which is arranged the organic electroluminescent device 11. It may be formed from any known material such as quartz, glass, metal foil, and plastic film or sheet. Preferable among them are quartz and glass. The plastic material includes methacrylic resin typified by polymethyl methacrylate (PMMA), polyesters such as polyethylene terephthalate (PET), polyethylene naphthalate (PEN), and polybutylene naphthalate (PBN), and polycarbonate resin. The plastic material should preferably have laminate structure or surface treatment to cope with water or gas permeability.

<Anode>

The anode 13 may be formed from any material which has a work function with reference to vacuum level large enough for efficient hole injection. Examples of such a material include aluminum (Al), chromium (Cr), molybdenum (Mo), tungsten (w), copper (Cu), silver (Ag), gold (Au), alloys and oxides thereof, and oxides of such alloys, such as alloy of tin oxide ($SnO_2$) and antimony (Sb), ITO (indium tin oxide), InZnO (indium zinc oxide), alloy of zinc oxide (ZnO) and aluminum (Al), oxides thereof, and a mixture thereof.

The anode 13 may also be that of laminate structure including a first layer highly capable of light reflection and a second layer placed thereon with a great work function which transmits light.

The first layer may be formed from an alloy composed mainly of aluminum. The secondary component may be one or more elements having a smaller work function than aluminum. Such elements should preferably be lanthanoids. Despite their small work function, lanthanoids stabilize the anode and improve the anode's ability for hole injection. Other examples of the secondary component include silicon (Si) and copper (Cu).

If the secondary component in the aluminum alloy constituting the first layer is Nd, Ni, Ti, or the like, which stabilizes aluminum, their total content should preferably be no more than about 10 wt %. This condition is necessary for the aluminum alloy layer to have an adequate reflectivity and to remain stable for accurate fabrication during the manufacturing process of the organic electroluminescent device because of good machining accuracy and chemical stability. Thus, the first layer makes the anode 13 improve in conductivity and adhesion to the substrate 12.

The second layer may be formed from at least one of aluminum alloy oxide, molybdenum oxide, zirconium oxide, chromium oxide, and tantalum oxide. For example, the second layer may be composed of an aluminum alloy oxide layer (including natural oxide film) and a lanthanoide as a secondary component. In this case, the second layer has a good transmittance because a lanthanoide oxide has a high transmittance. Consequently, the surface of the first layer has a high reflectivity. Moreover, the second layer may be a transparent conductive layer of ITO (indium tin oxide) or IZO (indium zinc oxide). Such a conductive layer makes the anode 13 improve in electron injection characteristics.

An additional conductive layer may be interposed between the anode 13 and the substrate 12 to improve adhesion between them. It is a transparent conductive film of ITO or IZO, for example.

In the case where the organic electroluminescent device 11 is applied to a display unit of active matrix type, the anode 13 is patterned for each pixel and connected to each driving thin-film transistor formed on the substrate 12. In this case, the anode 13 is provided with an insulating film (not shown) which has an opening through which the anode 13 exposes itself in each pixel.

<Hole Injection Layer and Hole Transport Layer>

Both the hole injection layer 14a and the hole transport layer 14b are intended for efficient hole injection to the light-emitting layer 14c. They may be formed from benzidine, styrylamine, triphenylamine, porphyrin, triphenylene, azatriphenylene, tetracyanoquiodimethane, triazole, imidazole, oxidiazole, polyarylalkane, phenylenediamine, arylamine, oxazole, anthracene, fluorenone, hydrazone, stilbene, and derivatives thereof; polysilane compounds, vinylcarbazole compounds, thiophene compounds, aniline compounds, and similar heterocyclic conjugate compounds in the form of monomer, oligomer, and polymer.

Listed below are specific materials for the hole injection layer 14a and the hole transport layer 14b. α-naphthylphenyl phenylenediamine, porphyrin, metal tetraphenylporphyrin, metal naphthalocyanine, hexacyanoazatriphenylene, 7,7,8,8-tetracyanoquinodimethane (TCNQ), 7,7,8,8-tetracyano-2,3,5,6-tetrafluoroquinodimethane (F4-TCNQ), tetracyano-4,4,4-tris(3-methylphenyl phenylamino)triphenylamine, N,N,N',N'-tetrakis(p-tolyl)p-phenylenediamine, N,N,N',N'-tetraphenyl-4,4'-diaminobiphenyl, N-phenylcarbazole, 4-di-p-tolylaminostilbene, poly(paraphenylenevinylene), poly(thiophenevinylene), and poly(2,2'-thienylpyrrol). They are not limitative.

<Light-Emitting Layer>

The light-emitting layer 14c is a region in which recombination occurs for holes injected from the anode 13 and electrons injected from the cathode 15 when voltage is applied to the anode 13 and the cathode 15.

In the embodiment of the present invention, the light-emitting layer 14c is composed of an anthracene compound as the host and a blue or green fluorescent dye as the guest doped therein. It emits bluish or greenish light. The foregoing embodiment is not limitative, however.

The host material constituting the light-emitting layer 14c in the present embodiment should preferably be an anthracene derivative represented by the formula (3) below which is selected from aromatic hydrocarbon compounds having the anthracene skeleton.

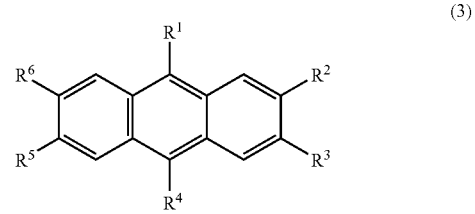

(3)

In the formula (3), $R^1$ to $R^6$ independently denote a hydrogen atom, halogen atom, hydroxyl group, cyano group, nitro group, any of carbonyl group, carbonyl ester group, alkyl group, alkenyl group, and alkoxyl group, which may be substituted with a group having no more than 20 carbon atoms, and any of silyl group, aryl group, amino group, and heterocyclic group, which may be substituted with a group having no more than 30 carbon atoms.

The aryl groups represented by $R^1$ to $R^6$ in the formula (3) include, for example, phenyl group, 1-naphthyl group, 2-naphthyl group, fluorenyl group, 1-anthryl group, 2-anthryl group, 9-anthryl group, 1-phenanthryl group, 2-phenanthryl group, 3-phenanthryl group, 4-phenathryl group, 9-phenathryl group, 1-naphthacenyl group, 2-naphthacenyl group, 9-naphthacenyl group, 1-pyrenyl group, 2-pyrenyl group, 4-pyrenyl group, 1-crycenyl group, 6-crycenyl group, 2-fluoranethenyl group, 3-fluoranethenyl group, 2-biphenylyl group, 3-biphenylyl group, 4-biphenylyl group, o-tolyl group, m-tolyl group, p-tolyl group, and p-t-butylphenyl group.

The heterocyclic groups represented by $R^1$ to $R^6$ include 5- or 6-membered aromatic heterocyclic groups containing O, N, and S as the hetero atoms, and condensed polycyclic aromatic heterocyclic groups having 2 to 20 carbon atoms. These heterocyclic groups include thienyl group, furyl group, pyrrolyl group, pyridyl group, quinolyl group, quinoxalyl group, imidazopyridyl group, and benzothiazole group. Their typical examples are listed below.

1-pyrrolyl group, 2-pyrrolyl group, 3-pyrrolyl group, pyrazinyl group, 2-pyridinyl group, 3-pyridinyl group, 4-pyridinyl group, 1-indolyl group, 2-indolyl group, 3-indolyl group, 4-indolyl group, 5-indolyl group, 6-indolyl group, 7-indolyl group, 1-isoindolyl group, 2-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinoyl group, 5-isoquinolyl group, 6-isoquinolyl group, 7-isoquinolyl group, 8-isoquinolyl group, 2-quinoxalinyl group, 5-quinoxalinyl group, 6-quinoxalinyl group, 1-carbazolyl group, 2-carbazolyl group, 3-carbazolyl group, 4-carbazolyl group, 9-carbozolyl group, 1-phenanthridinyl group, 2-phenanthridinyl group, 3-phenanthridinyl group, 4-phenanthridinyl group, 6-phenanthridinyl group, 7-phenanthridinyl group, 8-phenanthridinyl group, 9-phenathrdidinyl group, 10-phenathrdidinyl group, 1-acridinyl group, 2-acridinyl group, 3-acridinyl group, 4-acridinyl group, and 9-acridinyl group.

The amino groups represented by $R^1$ to $R^6$ include alkylamino group, arylamino group, and aralkylamino group. They should preferably have an aliphatic group with 1 to carbon atoms and/or an aromatic group with 1 to 4 rings. Typical examples of such groups include dimethylamino group, diethylamino group, dibutylamino group, diphenylamino group, ditolylamino group, bisbiphenylylamino group, and dinaphthylamino group.

Incidentally, the substituent group mentioned above may be a ring formed by condensation from two or more substituents, or it may have its own substituent.

Tables 1 to 3 below show the typical examples of the substituted compounds listed above.

TABLE 1

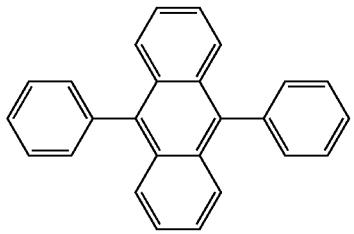

Structural formula A-1

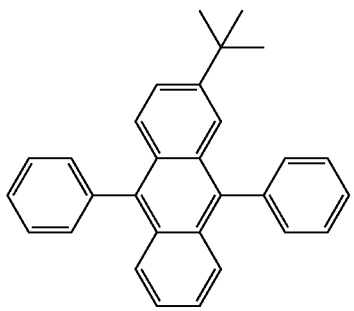

Structural formula A-2

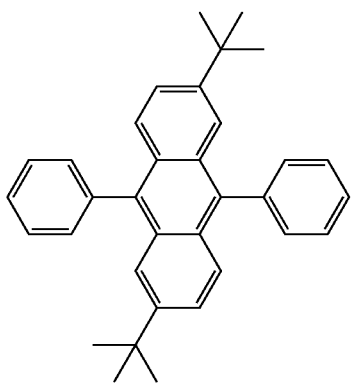

Structural formula A-3

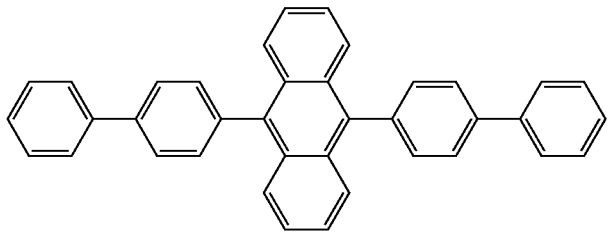

Structural formula A-4

TABLE 1-continued
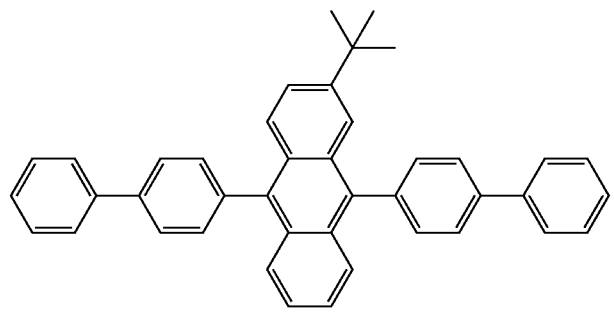
Structural formula A-5
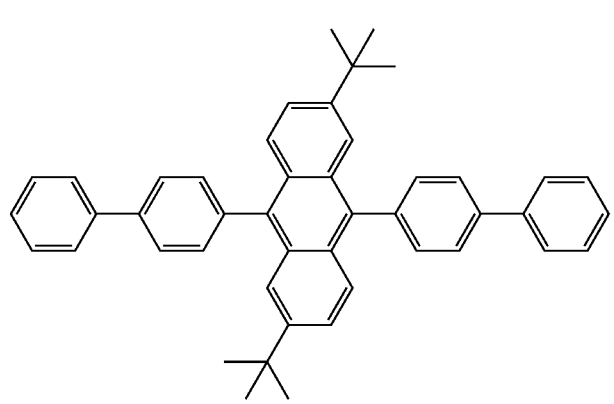
Structural formula A-6
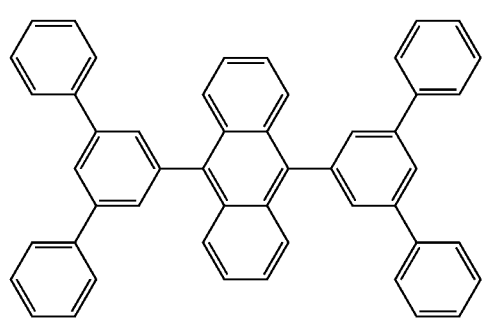
Structural formula A-7
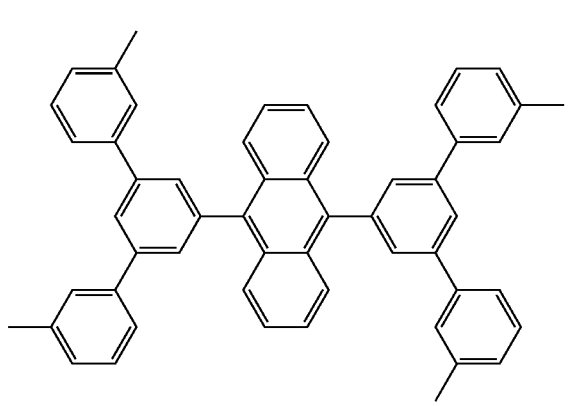
Structural formula A-8

TABLE 1-continued
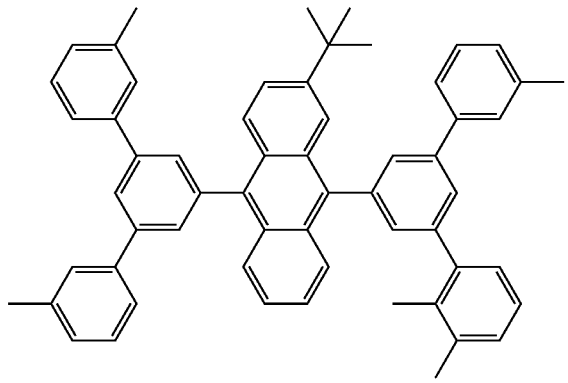
Structural formula A-9
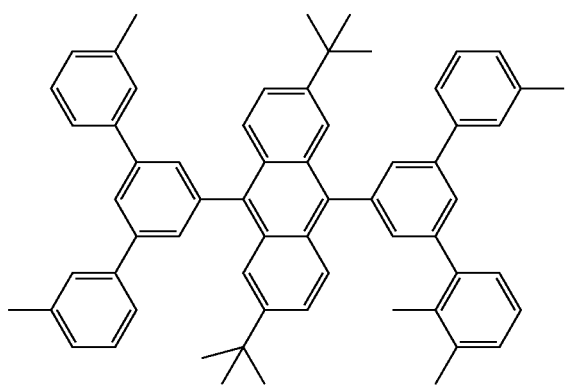
Structural formula A-10
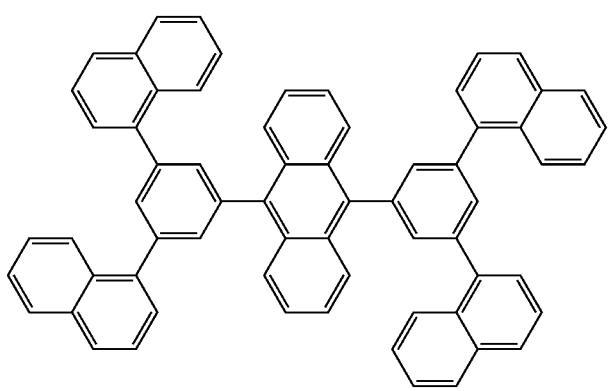
Structural formula A-11

TABLE 1-continued
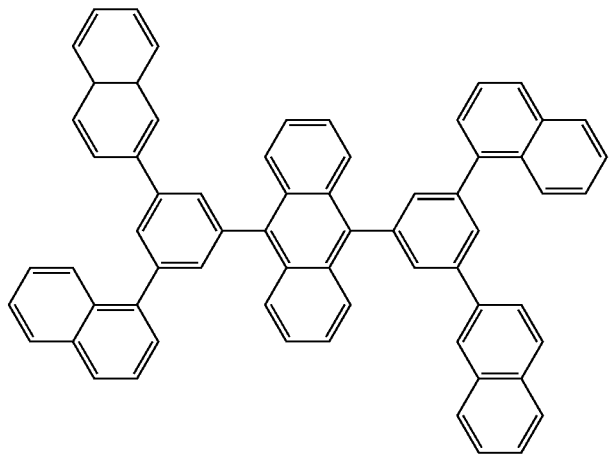
Structural formula A-12
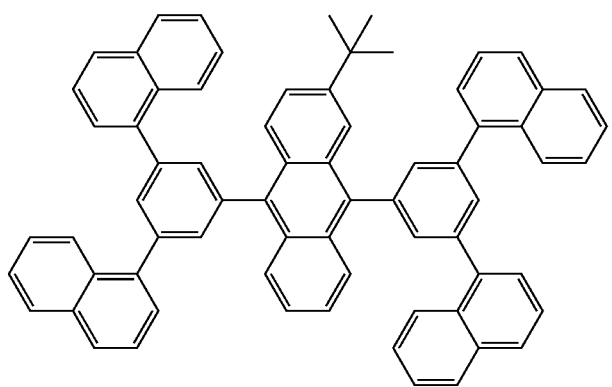
Structural formula A-13
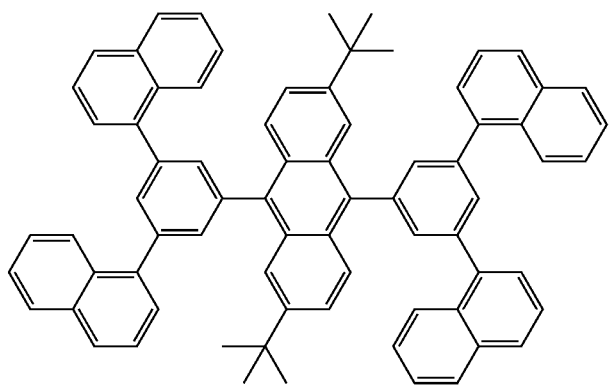
Structural formula A-14

TABLE 1-continued
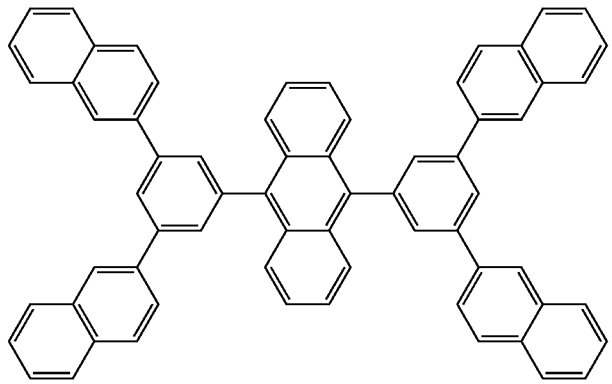
Structural formula A-15
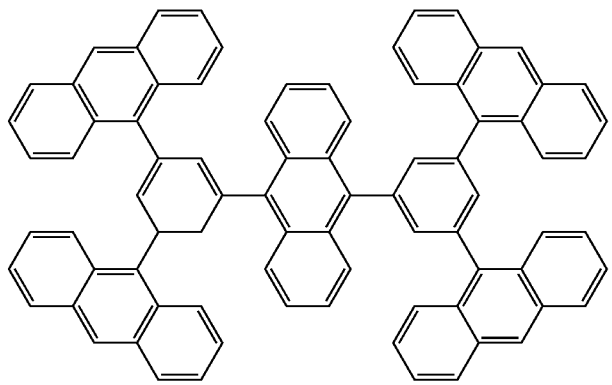
Structural formula A-16
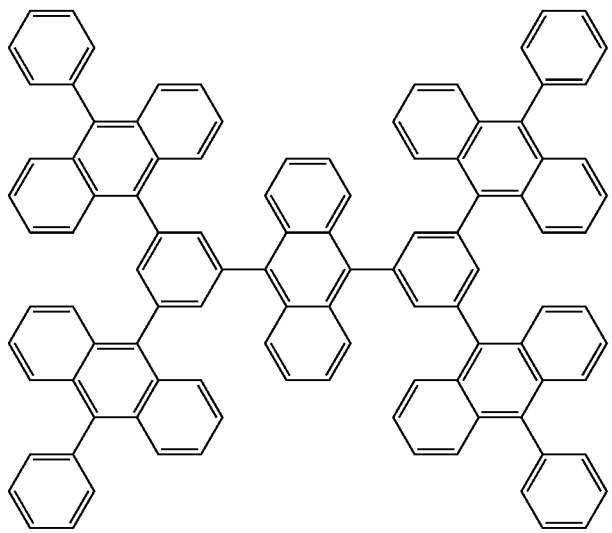
Structural formula A-17

TABLE 1-continued
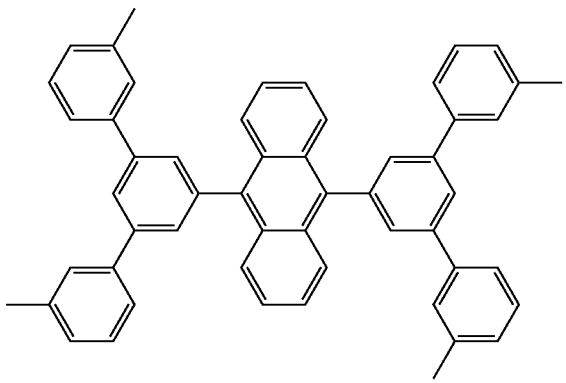
Structural formula A-18
TABLE 2
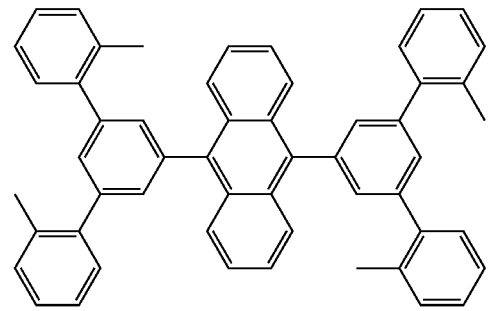
Structural formula A-19
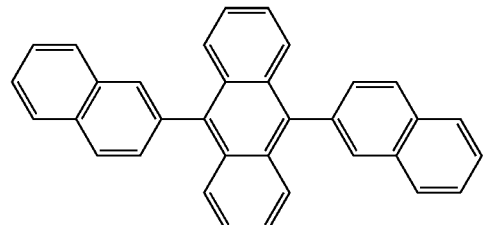
Structural formula A-20
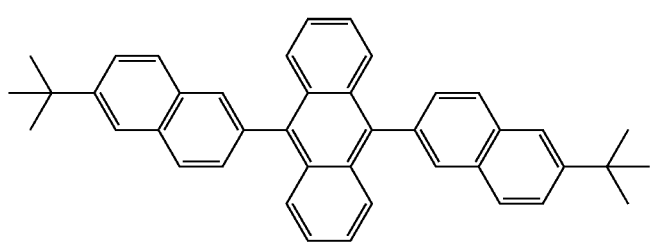
Structural formula A-21
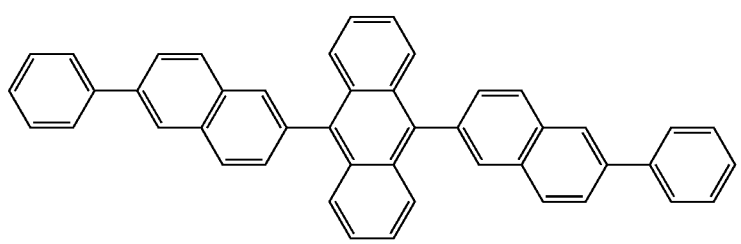
Structural formula A-22

TABLE 2-continued
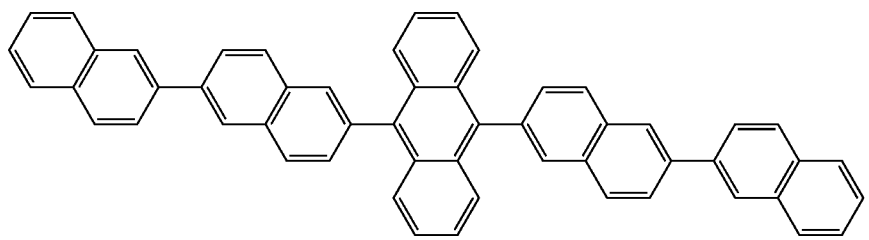
Structural formula A-23
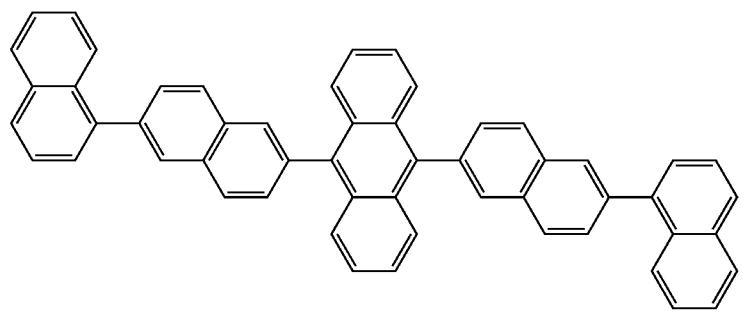
Structural formula A-24
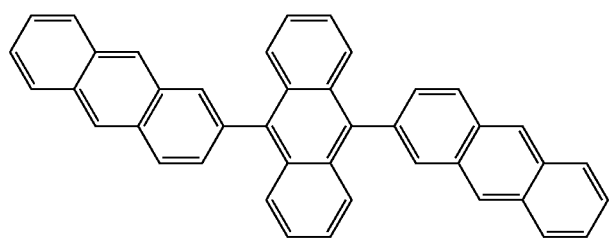
Structural formula A-25
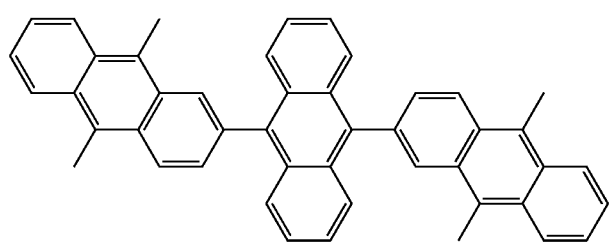
Structural formula A-26
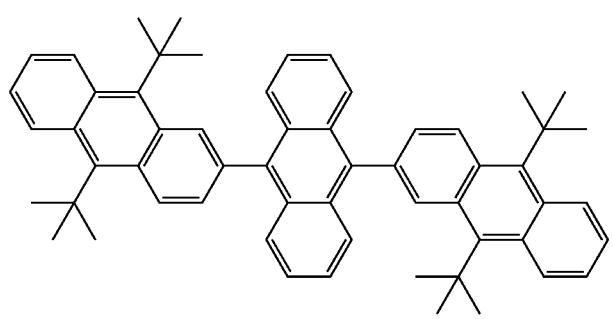
Structural formula A-27

TABLE 2-continued
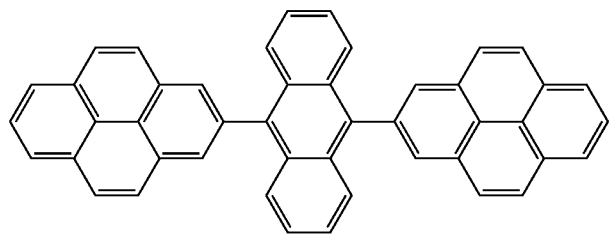
Structural formula A-28
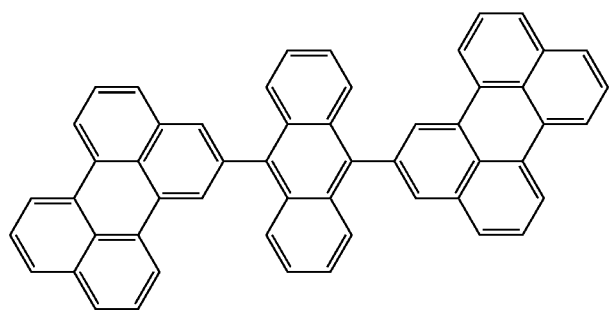
Structural formula A-29
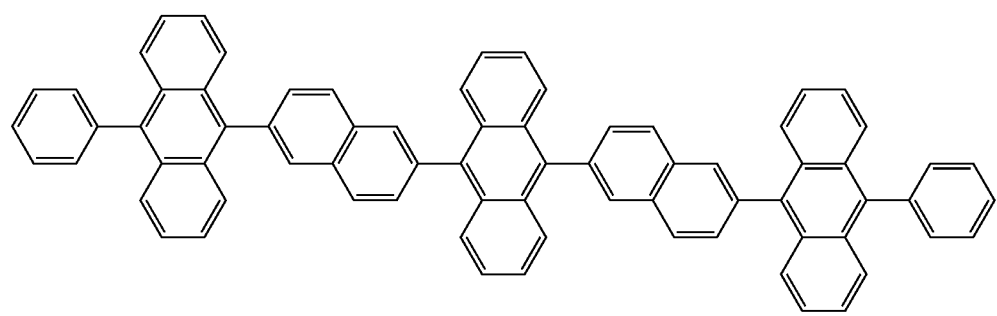
Structural formula A-30
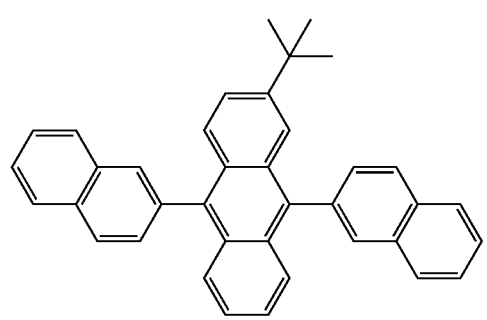
Structural formula A-31

TABLE 2-continued
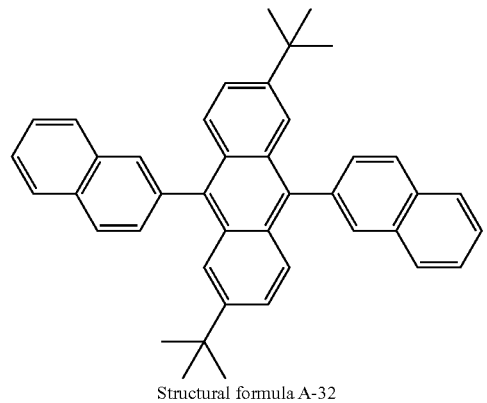
Structural formula A-32
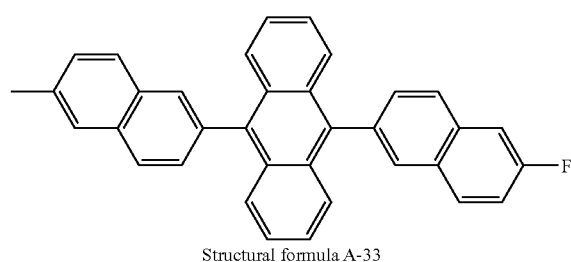
Structural formula A-33
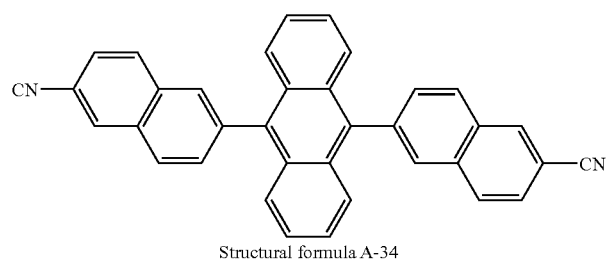
Structural formula A-34
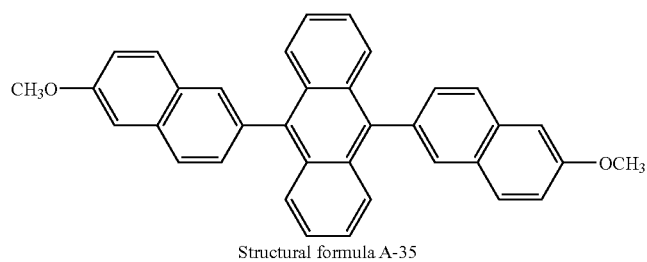
Structural formula A-35
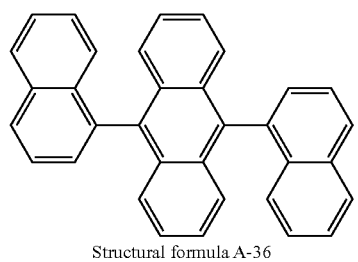
Structural formula A-36

TABLE 3
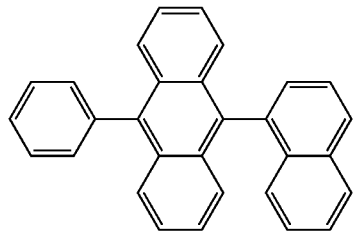
Structural formula A-37
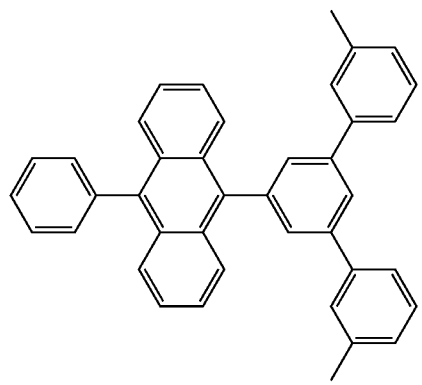
Structural formula A-38
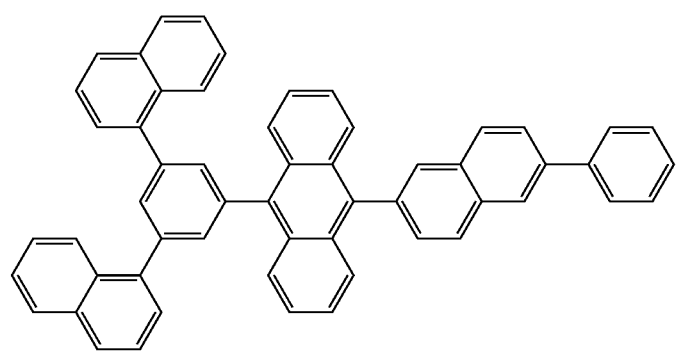
Structural formula A-39
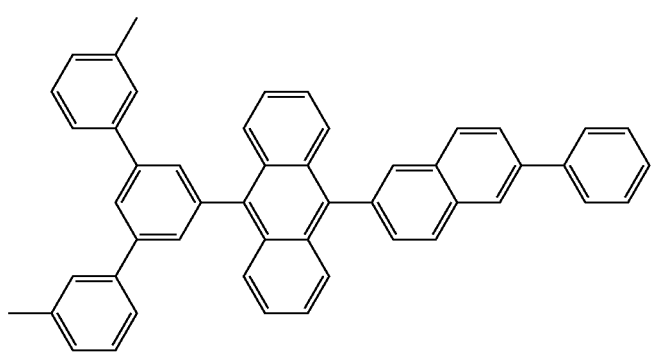
Structural formula A-40

TABLE 3-continued
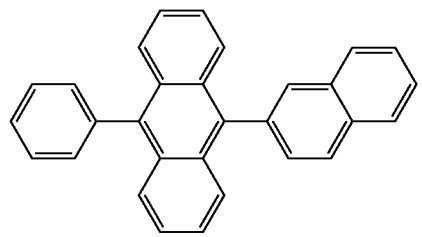
Structural formula A-41
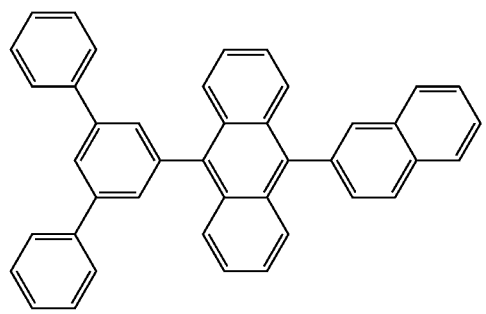
Structural formula A-42
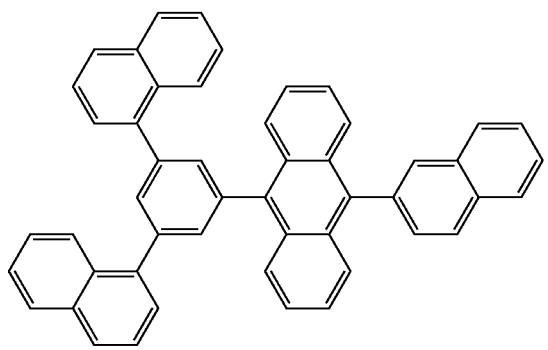
Structural formula A-43
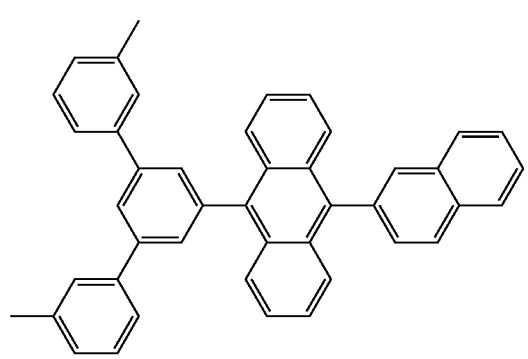
Structural formula A-44

TABLE 3-continued
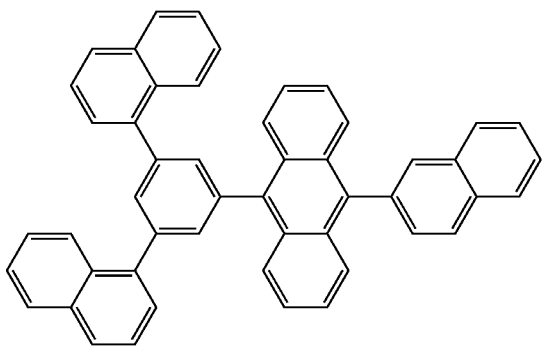
Structural formula A-45
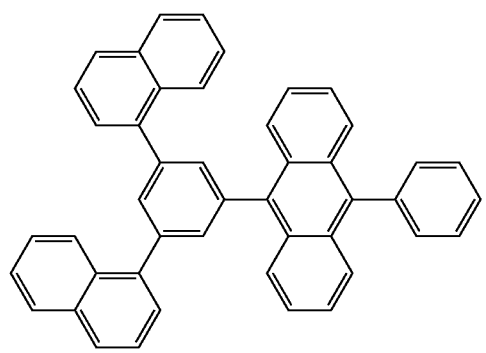
Structural formula A-46
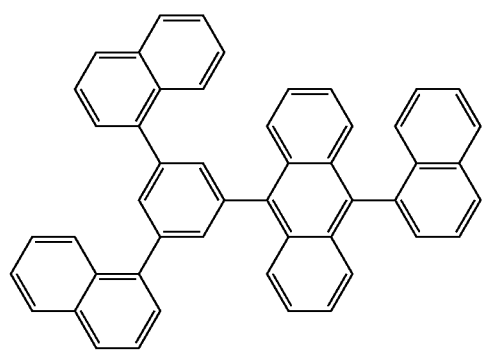
Structural formula A-47
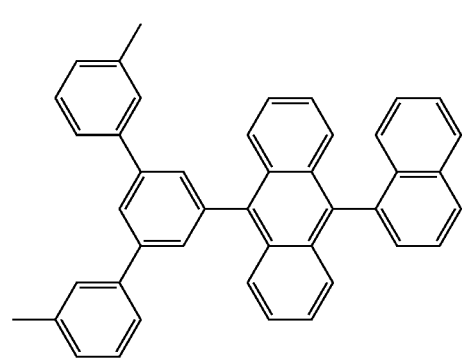
Structural formula A-48

TABLE 3-continued

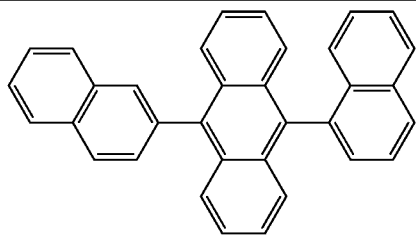

Structural formula A-49

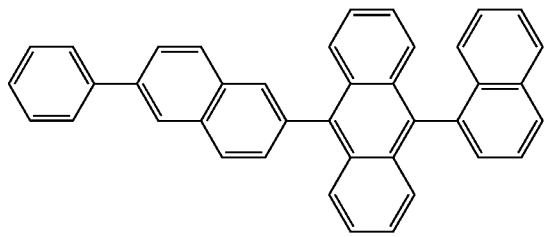

Structural formula A-50

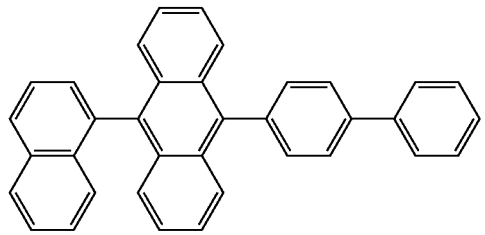

Structural formula A-51

The guest material for the light-emitting layer 14c is an organic material selected from low-molecular weight fluorescent dyes, fluorescent polymers, and metal complexes, which is capable of efficient light emission.

The blue guest material is an organic compound which has a peak within wavelengths ranging from about 400 to 490 nm. Examples of such a compound include naphthalene derivatives, anthracene derivatives, naphthacene derivatives, styrylamine derivatives, and bis(adinyl)methene boron complex. Preferable among these examples are aminonaphthalene derivatives, aminoanthracene derivatives, aminochrysene derivatives, aminopyrene derivatives, styrylamine derivatives, and bis(adinyl)methene boron complex.

The green guest material is an organic compound which has a peak within wavelengths ranging from about 490 to 580 nm. Examples of such a compound include naphthalene derivatives, anthracene derivatives, pyrene derivatives, naphthacene derivatives, fluoranthene derivatives, perylene derivatives, coumarin derivatives, quinacridone derivatives, indeno[1,2,3-cd]perylene derivatives, and bis(adinyl)methene boron complex. Preferable among these examples are aminoanthracene derivatives, fluoranthene derivatives, coumarin derivatives, quinacridone derivatives, indeno[1,2,3-cd]perylene derivatives, and bis(adinyl)methene boron complex.
<Naphthacene Compound Layer>

The naphthacene compound layer 14d traps holes to prevent them from entering the electron transport layer 14e from the light-emitting layer 14c, and it also promotes efficient recombination of holes which have been blocked by the naphthacene compound layer 14d, with electrons in the light-emitting layer 14c. Thus, it extends the life of the electroluminescent device.

The naphthacene compound layer 14d contains no less than 80 wt % of naphthacene compound represented by the formula (1) above.

In the formula (1), the aryl group represented by $R^1$ to $R^8$ includes, for example, phenyl group, 1-naphthyl group, 2-naphthyl group, fluorenyl group, 1-anthryl group, 2-anthryl group, 9-anthryl group, 1-phenanthryl group, 2-phenanthryl group, 3-phenanthryl group, 4-phenathryl group, 9-phenathryl group, 1-naphthacenyl group, 2-naphthacenyl group, 9-naphthacenyl group, 1-pyrenyl group, 2-pyrenyl group, 4-pyrenyl group, 1-crycenyl group, 6-crycenyl group, 2-fluoranethenyl group, 3-fluoranethenyl group, 2-biphenylyl group, 3-biphenylyl group, 4-biphenylyl group, o-tolyl group, m-tolyl group, p-tolyl group, and p-t-butylphenyl group.

The heterocyclic groups represented by $R^1$ to $R^8$ include 5- or 6-membered aromatic heterocyclic groups containing O, N, and S as the hetero atoms, and condensed polycyclic aromatic heterocyclic groups having 2 to 20 carbon atoms. These heterocyclic groups include thienyl group, furyl group, pyrrolyl group, pyridyl group, quinolyl group, quinoxalyl group, imidazopyridyl group, and benzothiazole group. Their typical examples are listed below.
1-pyrrolyl group, 2-pyrrolyl group, 3-pyrrolyl group, pyrazinyl group, 2-pyridinyl group, 3-pyridinyl group, 4-pyridinyl group, 1-indolyl group, 2-indolyl group, 3-indolyl group, 4-indolyl group, 5-indolyl group, 6-indolyl group, 7-indolyl group, 1-isoindolyl group, 2-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuralyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinoyl group, 5-isoquinolyl group, 6-isoquinolyl group, 7-isoquinolyl group, 8-isoquinolyl group, 2-quinoxalinyl group, 5-quinoxalinyl group, 6-quinoxalinyl group, 1-carbazolyl group, 2-carbozolyl group, 3-carbazolyl group, 4-carbazolyl group, 9-carbozolyl group, 1-phenanthridinyl group, 2-phenanthridinyl group, 3-phenanthridinyl group, 4-phenanthridinyl group, 6-phenanthridinyl group, 7-phenanthridinyl group, 8-phenanthridinyl group, 10-phenanthrdidinyl group, 1-acridinyl group, 2-acridinyl group, 3-acridinyl group, 4-acridinyl group, and 9-acridinyl group.

The naphthacene compound represented by the formula (1) above should preferably be one represented by the formula (2) shown below.

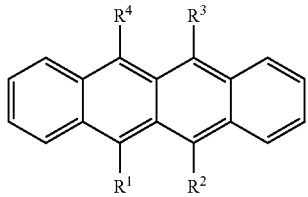

(2)

In the formula (2), $R^1$ to $R^4$ independently denote any of hydrogen atom, substituted or unsubstituted phenyl group, substituted or unsubstituted biphenyl group, substituted or unsubstituted naphthyl group, heterocyclic group, phenyl-substituted heterocyclic group, and condensed polycyclic aromatic heterocyclic group having no more than 13 carbon atoms.

It is desirable that $R^1$ to $R^4$ in the formula (2) above should independently be any of hydrogen atom, substituted or unsubstituted phenyl group, substituted or unsubstituted biphenyl group, and substituted or unsubstituted naphthyl group.

According to an embodiment of the present invention, the naphthacene compound layer 14d formed from the above-mentioned naphthacene compound extends the life of the organic electroluminescent device.

Typical examples of the naphthacene compound represented by the formula (2) are listed in Tables 4 to 6 below. They are not limitative, however.

TABLE 4

| Compound | R1 | R2 | R3 | R4 |
|---|---|---|---|---|
| structural formula-1 | H | H | H | H |
| structural formula-2 | H | $CH_3$ | $CH_3$ | H |
| structural formula-3 | H | $C_2H_5$ | $C_2H_5$ | H |
| structural formula-4 | $C_2H_5$ | $C_2H_5$ | $C_2H_5$ | $C_2H_5$ |
| structural formula-5 | $C_6H_5$ | $C_6H_5$ | $C_6H_5$ | $C_6H_5$ |
| structural formula-6 | phenyl | H | phenyl | H |
| structural formula-7 | phenyl | phenyl | H | H |
| structural formula-8 | phenyl | H | H | phenyl |
| structural formula-9 | phenyl | phenyl | phenyl | phenyl |
| structural formula-10 | biphenyl | H | H | biphenyl |
| structural formula-11 | biphenyl | biphenyl | H | H |

TABLE 4-continued

| Compound | R1 | R2 | R3 | R4 |
|---|---|---|---|---|
| structural formula-12 | biphenyl | H | biphenyl | H |
| structural formula-13 | biphenyl | biphenyl | quaterphenyl | |
| structural formula-14 | biphenyl | phenyl | biphenyl | phenyl |
| structural formula-15 | biphenyl | biphenyl | phenyl | phenyl |
| structural formula-16 | biphenyl | phenyl | phenyl | biphenyl |
| structural formula-17 | biphenyl | biphenyl | phenyl | phenyl |
| structural formula-18 | naphthyl | naphthyl | H | H |
| structural formula-19 | naphthyl | H | naphthyl | H |
| structural formula-20 | naphthyl | H | H | naphthyl |

TABLE 5

| Compound | R1 | R2 | R3 | R4 |
|---|---|---|---|---|
| structural formula-21 | naphthyl | naphthyl | naphthyl | naphthyl |
| structural formula-22 | naphthyl | naphthyl | phenyl | phenyl |
| structural formula-23 | naphthyl | phenyl | naphthyl | phenyl |

TABLE 5-continued

| Compound | R1 | R2 | R3 | R4 |
| --- | --- | --- | --- | --- |
| structural formula-24 | 2-naphthyl | phenyl | phenyl | 2-naphthyl |
| structural formula-25 | 2-naphthyl | 2-naphthyl | 4-biphenyl | 4-biphenyl |
| structural formula-26 | 2-naphthyl | 4-biphenyl | 2-naphthyl | 4-biphenyl |
| structural formula-27 | 2-naphthyl | 4-biphenyl | 4-biphenyl | 2-naphthyl |
| structural formula-28 | 1-naphthyl | 1-naphthyl | phenyl | phenyl |
| structural formula-29 | 1-naphthyl | phenyl | 1-naphthyl | phenyl |
| structural formula-30 | 1-naphthyl | phenyl | phenyl | 1-naphthyl |
| structural formula-31 | 1-naphthyl | 1-naphthyl | 1-naphthyl | 1-naphthyl |
| structural formula-32 | 1-naphthyl | 1-naphthyl | 2-naphthyl | 2-naphthyl |
| structural formula-33 | 1-naphthyl | 2-naphthyl | 1-naphthyl | 2-naphthyl |

TABLE 5-continued
| Compound | R1 | R2 | R3 | R4 |
|---|---|---|---|---|
| structural formula-34 | 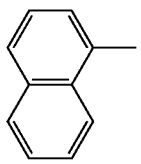 | 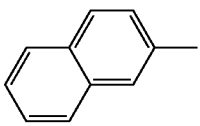 | 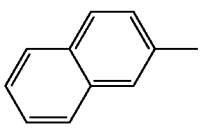 | 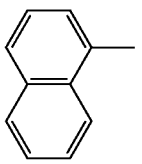 |
TABLE 6
| Compound | R1 | R2 | R3 | R4 |
|---|---|---|---|---|
| structural formula-35 | 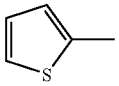 | H | 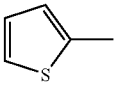 | H |
| structural formula-36 | 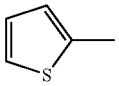 | 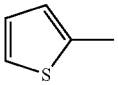 | H | H |
| structural formula-37 | 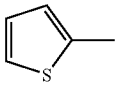 | H | H | 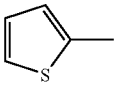 |
| structural formula-38 | 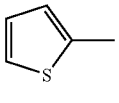 | 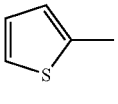 | 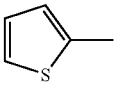 | 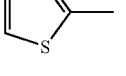 |
| structural formula-39 | 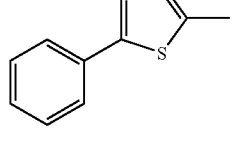 | H | H | 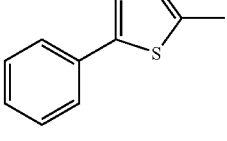 |
| structural formula-40 | 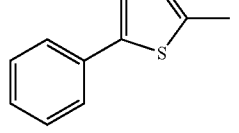 | 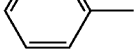 | 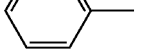 | 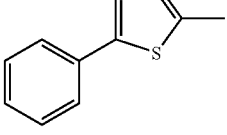 |
| structural formula-41 | 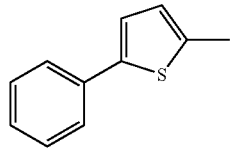 | 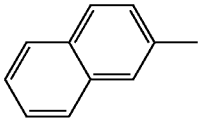 | 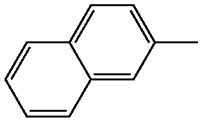 | 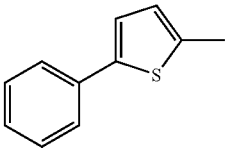 |
| structural formula-42 | 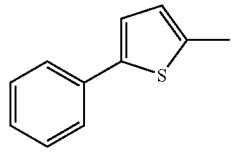 | 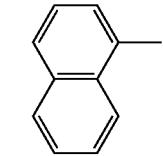 | 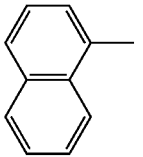 | 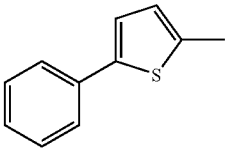 |
| structural formula-43 | 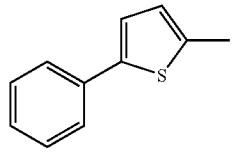 | 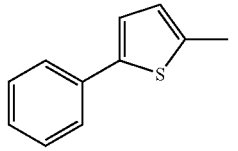 | 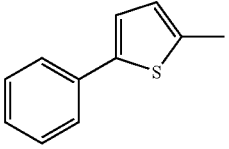 | 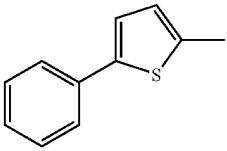 |

TABLE 6-continued

| Compound | R1 | R2 | R3 | R4 |
|---|---|---|---|---|
| structural formula-44 | 4-pyridyl | H | H | 4-pyridyl |
| structural formula-45 | 4-pyridyl | 4-pyridyl | H | H |
| structural formula-46 | 4-pyridyl | H | 4-pyridyl | H |
| structural formula-47 | 4-pyridyl | 4-pyridyl | 4-pyridyl | 4-pyridyl |
| structural formula-48 | 4-quinolyl | 4-quinolyl | 4-quinolyl | 4-quinolyl |
| structural formula-49 | 4-(2-naphthyl)phenyl | phenyl | phenyl | 4-(2-naphthyl)phenyl |
| structural formula-50 | 4-(2-naphthyl)phenyl | 4-(2-naphthyl)phenyl | 4-(2-naphthyl)phenyl | 4-(2-naphthyl)phenyl |

According to an embodiment of the present invention, the naphthacene compound layer 14d should preferably contain the naphthacene compound represented by the formula (1) above in an amount no less than 80 wt %, more preferably no less than 90 wt %. With an amount less than wt %, the naphthacene compound does not produce the effect of extending the life of the organic electroluminescent device.

According to an embodiment of the present invention, the naphthacene compound layer 14d should preferably have a thickness of 0.5 to 10 nm, more preferably 1 to 5 nm. With a thickness in excess of 10 nm, it does not provide a satisfactory color purity because the naphthacene compound emits light that mixes with light emitted by the light-emitting layer. With a thickness smaller than 0.5 nm, it does not produce the effect of extending the life of the organic electroluminescent device.

The naphthacene compound layer 14d is acceptable so long as it contains the naphthacene compound represented by the formula (1) above in an amount no less than 80 wt %. Although it may contain an additional component selected from anthracene compounds, pyrene compound, and pentacene compound, it should preferably be composed solely of the naphthacene compound represented by the formula (1) above. It may be formed by vapor deposition as in other organic layers.

<Electron Transport Layer>

The electron transport layer 14e is intended for transportation of electrons injected from the cathode 15 to the light-emitting layer 14c. It may be formed from such material as quinoline, perylene, phenanthroline, bisstyryl, pyrazine, triazole, oxazole, oxadiazole, fluorenone, and derivatives and metal complexes thereof. Their typical examples include tris (8-hydroxyquinoline)aluminum (abbreviated as Alq$_3$), anthracene, naphthalene, phenanthrene, pyrene, perylene, butadiene, coumarin, acridine, stilbene, 1,10-phenanthroline, and derivatives and metal complexes thereof.

<Organic Layer>

According to the embodiment of the present invention, the organic layer 14 includes the hole injection layer 14a, the hole transport layer 14b, the light-emitting layer 14c, the naphthacene compound layer 14d, and the electron transport layer 14e, which are placed one over another on the anode 13.

Incidentally, the organic layer 14 is not limited to the layer structure mentioned above. It is acceptable so long as it includes at least the light-emitting layer 14c, the naphthacene compound layer 14d, and the electron transport layer 14e, with the naphthacene compound layer 14d being interposed between the light-emitting layer 14c and the electron transport layer 14e. It may take another layer structure according to need. For example, the light-emitting layer 14c may be one capable of transporting holes, electrons, or both.

Another layer structure may be such that the light-emitting layer 14c and the naphthacene compound layer 14d hold between them an additional layer of host material which is not detrimental to the effect of the present invention. Such an additional layer includes an auxiliary light-emitting layer that emits blue light or shorter wavelength light. It should be composed of a host material and a light-emitting dopant. Examples of such compounds include naphthalene derivatives, anthracene derivatives, naphthacene derivatives, styrylamine derivatives, and bis(adinyl)methene boron complex.

Preferable among these examples are aminonaphthalene derivatives, aminoanthracene derivatives, aminochrysene derivatives, aminopyrene derivatives, styrylamine derivatives, and bis(adinyl)methene boron complex. The auxiliary light-emitting layer permits the energy generated by recombination to move rapidly to the light-emitting layer 14c, thereby contributing to light emission.

In the meantime, the light-emitting layer is formed by thermal transfer method or shadow mask method. The one formed by the first method is poorer in light-emission efficiency and brightness life than the one formed by the second method. The disadvantage of the thermal transfer method is that when the hole transport layer 14b is transferred from a vacuum into an inert gas for the thermal transfer process, the surface of the hole transport layer 14b traps impurities to destroy the carrier balance. This problem is serious in the organic electroluminescent device for green light which is designed such that light emanates from the interface of the hole transport layer 14b.

In order to address this problem, the organic electroluminescent device according to an embodiment of the present invention should preferably be designed such that the naphthacene compound layer 14d is placed on that side of the hole transport layer 14b which faces the light-emitting layer 14c, and an auxiliary light-emitting layer is interposed between the light-emitting layer 14c and the naphthacene compound layer 14d. This structure moves the position of recombination from the hole transport layer 14b to the auxiliary light-emitting layer and the hole transport layer 14b is protected against contamination at the time of thermal transfer, which contributes to efficient light emission and extended life.

Moreover, laminate structure is possible for individual layers constituting the organic layer 14, such as hole injection layer 14a, hole transport layer 14b, light-emitting layer 14c, naphthacene compound layer 14d, and electron transport layer 14e.

<Cathode>

The cathode 15 is formed on the organic layer 14 constructed as mentioned above. It includes a first layer 15a and a second layer 15b, which are sequentially arranged on the organic layer 14.

The first layer 15a is formed from a material which has a small work function and excels in optical transmission. Examples of such a material include lithium oxide ($Li_2O$), cesium carbonate ($Cs_2CO_3$), and a mixture thereof. The first layer 15a may also be formed from alkaline earth metals, such as calcium (Ca) and barium (Ba), alkali metals, such as lithium and cesium, those metals which have a small work function, such as indium (In) and magnesium (Mg), and oxides, complex oxides, and fluorides thereof, in the form of simple substance, mixture, or alloy. They contribute to stability.

The second layer 15b is a thin film of MgAg with good optical transmission. It may additionally contain an organic light-emitting material such as alumiquinoline complex, styrylamine derivative, and phthalocyanine derivative. In this case, the cathode 15 may additionally have a transparent third layer of MgAg.

In the case where the organic electroluminescent device 11 is used for the display unit of active matrix type, the cathode 15 is formed in the form of continuous film on the substrate 12 such that it is insulated from the anode 13 by the organic layer 14 and the insulating film (not shown) mentioned above. It functions as a common electrode for pixels.

The above-mentioned layer structure for the cathode 15 is not limitative; any layer structure may be employed according to the structure of the device to be produced. Although it includes the first layer 15a (which is an inorganic layer to promote electron injection into the organic layer 14) and the second layer 15b (which is an inorganic layer that functions as an electrode), it may take single-layer structure in which the first inorganic layer functions also as the second inorganic layer. Such a single-layer structure may be coated with a transparent electrode of ITO.

The organic electroluminescent device constructed as mentioned above is usually supplied with direct current. However, direct current may be replaced by alternating current or pulse current. The amperage and voltage are not specifically restricted so long as they are small enough not to destroy the device. Efficient light emission with the smallest possible electric energy is desirable in view of the device's power consumption and life.

In the case where the organic electroluminescent device 11 is of cavity structure, the cathode 15 is formed from a half-transparent half-reflecting material, so that multiple interference takes place between the reflecting surface of the anode 13 and the reflecting surface of the cathode 15 before light emanates from the cathode 15. The multiple interference and the resulting top emission amplify the intensity of outgoing light. The optical distance between the reflecting surface of the anode 13 and the reflecting surface of the cathode 15 is determined by the wavelength of outgoing light, and the thickness of individual layers is determined accordingly. The cavity structure enables the organic electroluminescent device of top emission type to perform efficient light emission and to emit light with a controlled spectrum.

The organic electroluminescent device constructed as mentioned above should preferably be covered with a protective film or passivation film (not shown) for protection from deterioration by moisture and oxygen in the atmospheric air. The protective film may be formed from silicon nitride (typically $Si_3N_4$), silicon oxide (typically $SiO_2$), silicon nitride oxide ($SiN_xO_y$, x>y) or silicon oxynitride ($SiO_xN_y$, x>y). It may also be formed from carbon such as diamond-like carbon (DLC) and carbon nanotube (CN). These films should preferably be constructed to be a single layer of a multi layer. Of these examples, compact nitride is desirable because of its outstanding ability to block out moisture, oxygen, and other impurities detrimental to the organic electroluminescent device 11.

Although the embodiment mentioned above is concerned with the organic electroluminescent device of top emission type, it is not intended to restrict the present invention. The present invention embraces that type of organic electroluminescent device which is constructed such that the organic layer including the light emitting layer and the electron transport layer is interposed between the anode and the cathode. Such a device includes a substrate, a cathode, an organic layer, and an anode, which are placed one over another. An organic electroluminescent device of bottom emission type (so-called transmission type) is also possible. In this case, the lower electrode adjacent to the substrate, which is a cathode (or an anode), is formed from a transparent material and the upper electrode opposite to the substrate, which is an anode (or a cathode), is formed from a reflecting material.

Moreover, the organic electroluminescent device according to an embodiment of the present invention includes any one which includes a pair of electrodes (anode and cathode) and an organic layer held between them. Therefore, the present invention is not restricted to the one which includes merely a pair of electrode and an organic layer. It covers those which have additional constituents, such as inorganic compound layer and inorganic component, not detrimental to its effect.

It has been confirmed that an extended life is achieved (as shown in the examples that follow) by the organic electroluminescent device constructed as mentioned above more easily than by the one which is not provided with the naphthacene compound layer 14d.

In addition, the organic electroluminescent device emits pure light inherent in the material constituting the light-emitting layer 14c, without mixing with light emitted from the naphthacene compound layer 14d (which emits yellow or red light) adjacent to the light-emitting layer 14c. This is because the naphthacene compound layer 14d traps holes penetrating the light-emitting layer 14c and prevents them from entering the electron transport layer 14e, so that the material (such as $Alq_3$) constituting the electron transport layer 14e is protected from deterioration. Moreover, the trapped holes effectively excite electrons in the host material constituting the light-emitting layer 14c. The result is that the light-emitting layer 14c emits light in a stable manner, which contributes to the extended life. The foregoing structure produces a remarkable effect on the extended life in the case where the guest material is an organic material that emits blue or green light.

It is apparent from the foregoing that the organic electroluminescent device 11 constructed as mentioned above has a long life while keeping a color purity.

Embodiment of Display Unit

<Display Unit>

Figure 2:
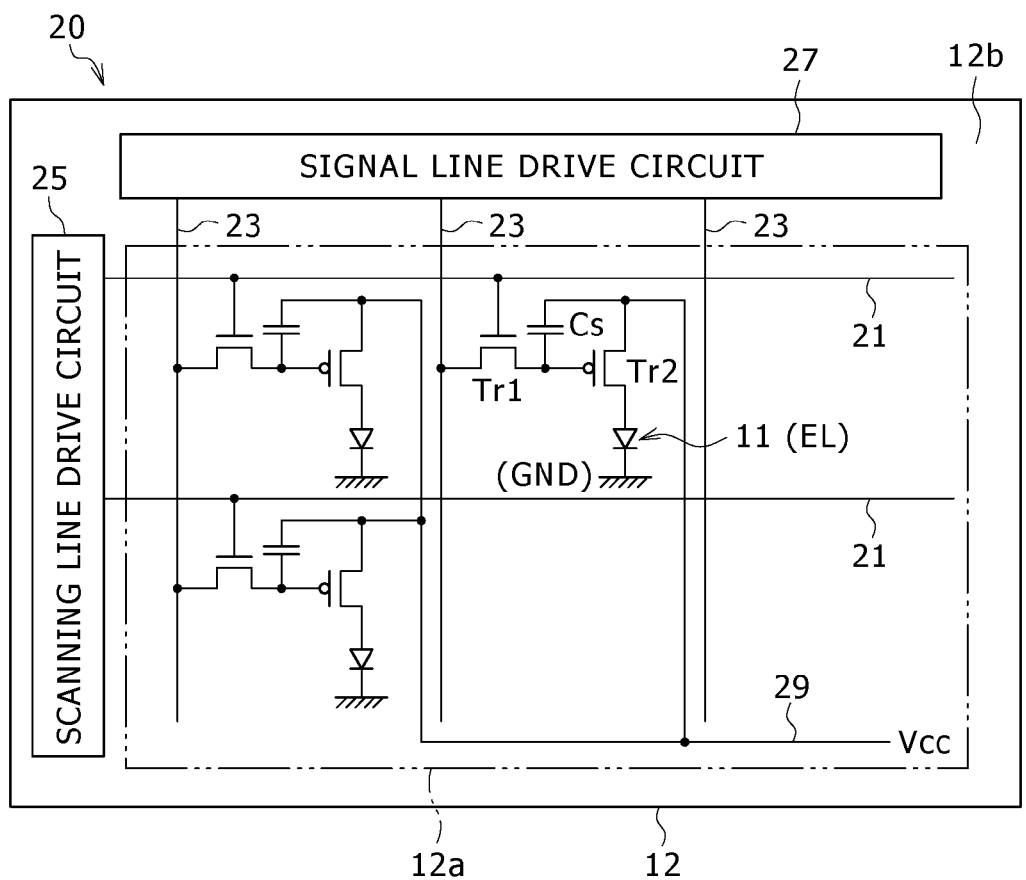
FIG. 2 is a schematic diagram showing the circuitry of the display unit according to one embodiment of the present invention.

Described below is one embodiment of the display unit (so-called organic EL display unit) constructed of the organic electroluminescent devices according to an embodiment of the present invention. FIG. 2 is a schematic diagram showing the circuit of the display unit. The display unit 20 of this embodiment is that of active matrix type which is constructed of the organic electroluminescent devices 11 according to an embodiment of the present invention.

As shown in FIG. 2, the display unit 20 is formed on the substrate 12 and is divided into two regions: the display region 12a surrounded by a broken line; and the peripheral region 12b. In the display region 12a are the scanning lines 21 and the signal lines 23, which are arranged horizontally and vertically. At each intersection of them is one pixel, and all the pixels constitute an array. In the peripheral region 12b are arranged the scanning line drive circuit 25 and the signal line drive circuit 27, the former driving the scanning lines 21 and the latter supplying the signal line 23 with video signals (or input signals) in response to brightness information.

The pixel at the intersection of the scanning line 21 and the signal line 23 has a circuit composed of a thin-film transistor Tr1 for switching, a thin-film transistor Tr2 for driving, a storage capacity Cs, and an organic electroluminescent device 11. The scanning driving circuit 25 works in such a way that the video signal fed from the signal line 23 through the thin-film transistor Tr1 for switching is held in the storage capacity Cs. Current in proportion to the amount of signal thus held is supplied to the organic electroluminescent device 11 through the thin-film transistor Tr2 for driving, so that the organic electroluminescent device 11 emits light. Incidentally, the thin-film transistor Tr2 for driving and the storage capacity Cs are connected to the common power supply line (Vcc) 29.

The pixel circuit mentioned above is a mere example to which an embodiment of the present invention is applied. It may be modified with additional capacity elements and transistors. The peripheral region 12b may also be modified in response to changes in circuits.

In the display unit 20 according to the embodiment of the present invention, each pixel is composed of three subpixels for red (R), green (G), and blue (B), and each subpixel is the organic electroluminescent device 11 explained above with reference to FIG. 1. A plurality of pixels (each being a set of three subpixels) are arranged on the substrate 12, so that the display unit is capable of full color display with good color reproducibility.

The display unit according to an embodiment of the present invention should preferably be constructed such that the organic electroluminescent devices are at least partly blue light emitting devices. The blue light emitting device has a long life and a high color purity, and hence it contributes to the full color display with good color reproducibility over a long period of time.

Moreover, the display unit according to an embodiment of the present invention should preferably be constructed such that the organic electroluminescent devices are at least partly green light emitting devices. The green light emitting device has a long life and a high color purity, and hence it contributes to the full color display with good color reproducibility over a long period of time.

The display unit 20 constructed of the organic electroluminescent devices 11 as mentioned above should preferably be provided with a sealing film that protects the organic electroluminescent devices 11 from deterioration by moisture and oxygen in the atmospheric air.

FIG. 3 is a schematic diagram showing the sealed display module suitable for the display unit according to an embodiment of the present invention.

The display unit according to an embodiment of the present invention may be in the form of sealed module shown in FIG. 3. This display module has the sealing part 31 which surrounds the display region 12a containing pixels arranged therein. The sealing part 31 is an adhesive that bonds the display region 12a to the sealing substrate 32 which is a transparent glass plate. The sealing substrate 32 may be provided with a color filter, protective film, shielding film, etc.

The substrate 12 for the display module in which is formed the display region 12a may be provided with the flexible printed circuit board 33 for input and output of signals between the display region 12a (pixel array) and the outside circuit.

The display unit 20 according to the embodiment of the present invention is constructed of the organic electroluminescent devices which emit light efficiently and have a long life as mentioned above. Therefore, it is capable of full color display with good color reproducibility and high reliability if it is constructed of three kinds of organic electroluminescent devices each emitting red, green, and blue light.

The above-mentioned display unit according to an embodiment of the present invention can be applied to various electronic machines and equipment, such as digital camera, notebook personal computer, portable terminal equipment like cellular phone, and video camera, which have display units for image signals generated inside or received from outside.

EXAMPLES

To illustrate the procedure for production of the organic electroluminescent device according to an embodiment of the present invention, Examples and Comparative Examples are described below with reference to FIG. 1. They are concluded with the result of evaluation of the devices.

Examples 1 to 4

The organic electroluminescent device 11 was produced in the following manner which has the light-emitting layer 14c containing a guest material for blue light emission.

First, the substrate 12, which is a glass plate measuring 30×30 mm, was coated with a thin film of Ag alloy (190 nm thick) functioning as a reflection layer and a thin film of ITO (12.5 nm thick) functioning as a transparent electrode. These two films constitute the anode 13. The substrate 12 with the anode 13 thereon serves as the cell for the organic electroluminescent device of top emission type.

On the anode 13 was formed the hole injection layer 14a (12 nm thick) as one constituent of the organic layer 14 by vacuum deposition at a rate of 0.2 to 0.4 nm/sec from m-MT-DATA represented by the formula (101) below. m-MTDATA stands for 4,4',4''-tris(phenyl-m-tolylamino)triphenylamine.

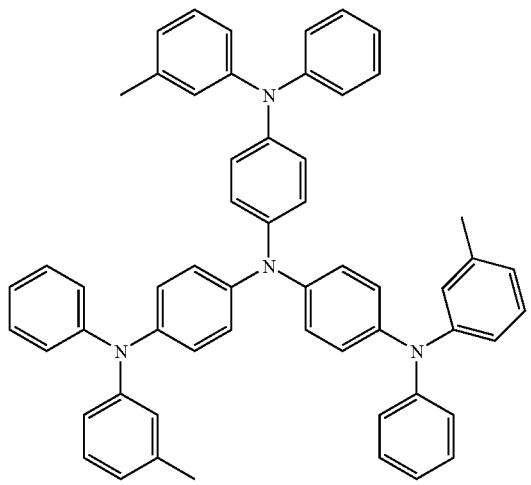

(101)

Next, on the hole injection layer 14a was formed the hole transport layer 14b (120 nm thick) by vacuum deposition at a rate of 0.2 to 0.4 nm/sec from α-NPD represented by the formula (102) below. α-NPD stands for N,N'-bis(1-naphthyl)-N,N'-diphenyl[1,1'-biphenyl]-4,4'-diamine.

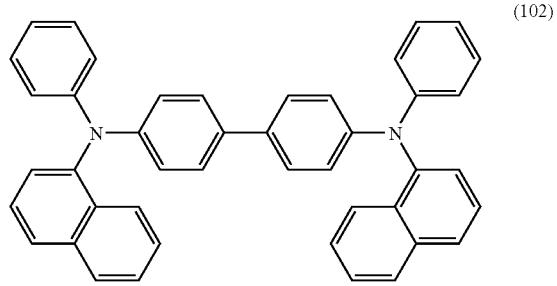

(102)

On the hole transport layer 14b was formed the light-emitting layer 14c (30 nm thick) by vacuum deposition from 9,10-di(2-naphthyl)anthracene (ADN) as the host material, which is represented by the structural formula A-20 (shown in Table 2). The host material (ADN) was doped with BD-052 (made by Idemitsu Kosan Co., Ltd.) as a blue dopant. The amount of the dopant was 5% in terms of the thickness ratio.

On the light-emitting layer 14c was formed the naphthacene compound layer 14d by vacuum deposition from rubrene represented by the structural formula (103) below. The thickness of the naphthacene compound layer 14d in Examples 1 to 4 was 1 nm, 3 nm, 5 nm, and 10 nm, respectively.

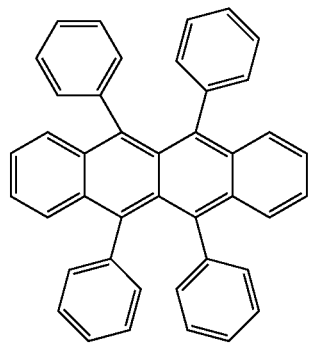

(103)

On the naphthacene compound layer 14d was formed the electron transport layer 14e by vacuum deposition from Alq$_3$ (8-hydroxyquinoline aluminum), such that the naphthacene compound layer 14d and the electron transport layer 14e have a total thickness of 28 nm. Thus, the thickness of the electron transport layer 14e in Examples 1 to 4 was 27 nm, 25 nm, 23 nm, and 18 nm, respectively.

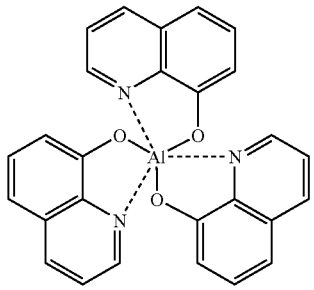

(104)

Thus there was formed the organic layer 14 including the hole injection layer 14a, the hole transport layer 14b, the light-emitting layer 14c, the naphthacene compound layer 14d, and the electron transport layer 14e, which are placed one over another. Then, on the organic layer 14 was formed the first layer 15a (about 0.5 nm thick) of the cathode 15 by vacuum deposition (at a rate of 0.01 nm/sec) from LiF. On the first layer 15a was formed the second layer 15b (11 nm thick) of the cathode 15 by vacuum deposition from MgAg.

In this way there was obtained the organic electroluminescent device 11 for each of Examples 1 to 4.

Comparative Example 1

The organic electroluminescent device 11 was prepared by repeating the same procedure as in Example 1 except that the naphthacene compound layer 14d was omitted and the thickness of the electron transport layer 14e which in formed directly on the light-emitting layer 14c was changed to 28 nm.

Comparative Example 2

The organic electroluminescent device 11 was prepared by repeating the same procedure as in Example 1 except that the electron transport layer 14e was omitted and the thickness of the naphthacene compound layer 14d on which the cathode 15 is directly formed was changed to 28 nm. In this organic electroluminescent device 11, the naphthacene compound layer 14d functions as the electron transport layer 14e.

Comparative Example 3

The organic electroluminescent device 11 was prepared by repeating the same procedure as in Example 1 except for the naphthacene compound layer 14d and the electron transport layer 14e having a thickness changed to 15 nm and 13 nm, respectively.

Results of Evaluation

The organic electroluminescent devices prepared in Examples 1 to 4 and Comparative Examples 1 to 3 mentioned above were examined for driving voltage (V) at a current density of 10 mA/cm$^2$ and color coordinate (x, y). They were also examined for half-time for brightness in the case of driving with a constant current at a current density of 100 mA/cm$^2$. The results are shown in Table 7. Incidentally, the color coordinate is that of the CIE colorimetric system.

TABLE 7

| | Thickness of naphthacene compound layer 14d (rubrene) | Voltage (V) | Color coordinate (x, y) | Half-time for brightness (hr) |
|---|---|---|---|---|
| Example 1 | 1 nm | 8.0 | (0.13, 0.10) | 750 |
| Example 2 | 3 nm | 8.0 | (0.13, 0.10) | 720 |
| Example 3 | 5 nm | 8.1 | (0.13, 0.10) | 680 |
| Example 4 | 10 nm | 8.2 | (0.13, 0.10) | 610 |
| Comparative Example 1 | None (Alq$_3$ 28 nm) | 8.1 | (0.13, 0.10) | 320 |
| Comparative Example 2 | 28 nm | 8.8 | (0.13, 0.16) | 80 |
| Comparative Example 3 | 15 nm | 8.4 | (0.13, 0.14) | 280 |

It is noted from Table 7 that the organic electroluminescent devices in Examples 1 to 4 have a much longer life at the same driving voltage than the one in Comparative Example 1 which does not have the naphthacene compound layer 14d. The sample in Comparative Example 2, which has the electron transport layer 14e replaced by rubrene, is inferior in color purity and life to those in Examples 1 to 4 because light from rubrene mixes to increase the y value of the color coordinate. In addition, those samples which have the naphthacene compound layer 14d no thicker than 10 nm have a longer life than the sample in Comparative Example 1 which does not have the naphthacene compound layer 14d. Those samples in Comparative Examples 2 and 3, which have the naphthacene compound layer 14d no thinner than 15 nm, are inferior in life to the samples in Examples 1 to 4 and Comparative Example 1.

It is concluded from the foregoing that the organic electroluminescent device 11 according to an embodiment of the present invention, which has the naphthacene compound layer 14d no thicker than 10 nm interposed between the electron transport layer 14e and the light-emitting layer 14c, enjoys long-lasting brightness owing to good charge balance for recombination. This effect is salient when the naphthacene compound layer 14d has a thickness of 1 nm or 3 nm.

Examples 5 and 6

The organic electroluminescent device 11 was prepared in which the guest material in the light-emitting layer is a green light emitting compound.

First, the substrate 12, which is a glass plate measuring 30×30 mm, was coated with a thin film of Ag alloy (190 nm thick) functioning as a reflection layer and a thin film of ITO (12.5 nm thick) functioning as a transparent electrode. These two films constitute the anode 13. The substrate 12 with the anode 13 thereon serves as the cell for the organic electroluminescent device of top emission type.

On the anode 13 was formed the hole injection layer 14a (8 nm thick) as one constituent of the organic layer 14 by vacuum deposition at a rate of 0.2 to 0.4 nm/sec from m-MT-DATA represented by the formula (101) above.

Next, on the hole injection layer 14a was formed the hole transport layer 14b (20 nm thick) by vacuum deposition at a rate of 0.2 to 0.4 nm/sec from A-NPD represented by the formula (102) above.

On the hole transport layer 14b was formed the light-emitting layer 14c (30 nm thick) by vacuum deposition from 9-(1-naphthyl)-10-(1-biphenyl)anthracene (ANB) as the host material, which is represented by the structural formula (A) below. The host material (ANB) was doped with a green dopant represented by the structural formula (B) below. The amount of the dopant was 9% in terms of the thickness ratio.

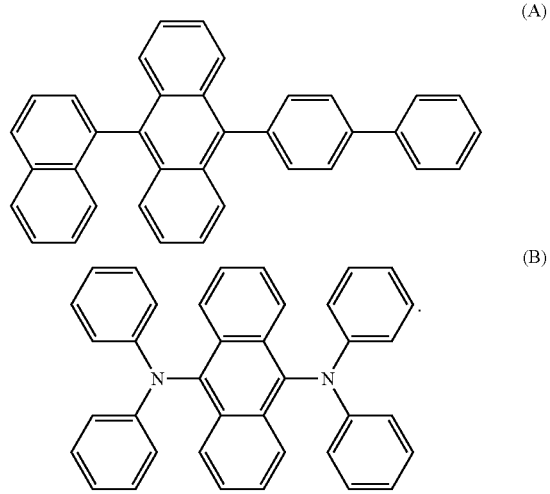

On the light-emitting layer 14c was formed the naphthacene compound layer 14d by vacuum deposition from a compound represented by the structural formula (105) below. The thickness of the naphthacene compound layer 14d in Examples 5 and 6 was 1 nm and 5 nm, respectively.

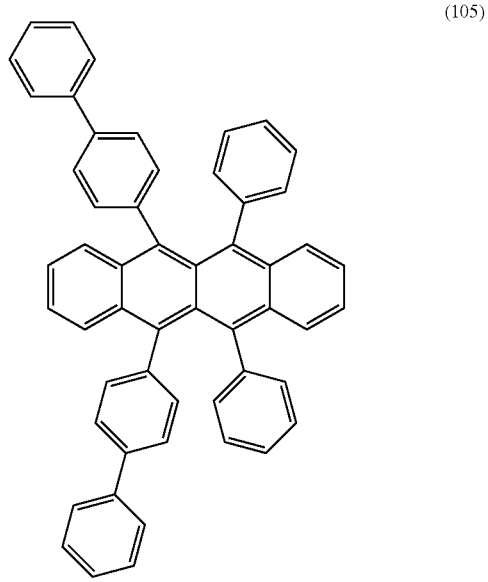

On the naphthacene compound layer 14d was formed the electron transport layer 14e by vacuum deposition from Alq₃ (8-hydroxyquinoline aluminum), such that the naphthacene compound layer 14d and the electron transport layer 14e have a total thickness of 40 nm. Thus, the thickness of the electron transport layer 14e in Examples and 6 was 39 nm and 35 nm, respectively.

Thus there was formed the organic layer 14 including the hole injection layer 14a, the hole transport layer 14b, the light-emitting layer 14c, the naphthacene compound layer 14d, and the electron transport layer 14e, which are placed one over another. Then, on the organic layer 14 was formed the first layer 15a (about 0.5 nm thick) of the cathode 15 by vacuum deposition (at a rate of 0.01 nm/sec) from LiF. On the first layer 15a was formed the second layer 15b (11 nm thick) of the cathode 15 by vacuum deposition from MgAg.

In this way there was obtained the organic electroluminescent device 11 for each of Examples 5 and 6.

Examples 7 and 8

The organic electroluminescent device 11 was prepared by repeating the same procedure as in Examples 5 and 6 except that the compound (105) for the naphthacene compound layer 14d was replaced by the compound represented by the formula (106) below.

(1-6)

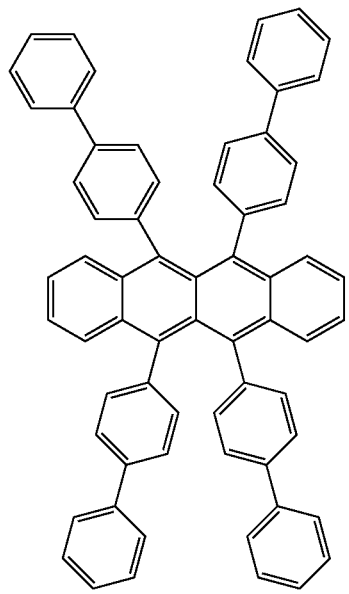

Thus there was obtained the organic electroluminescent devices 11 according to Examples 5 to 8.

Examples 9 and 10

The organic electroluminescent device 11 was prepared by repeating the same procedure as in Examples 5 and 6 except that the compound (105) for the naphthacene compound layer 14d was replaced by the compound represented by the formula (107) below.

(107)

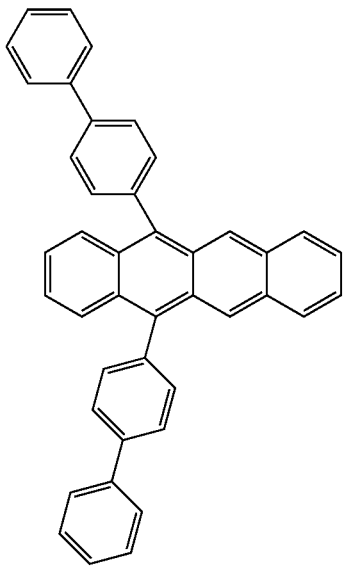

Comparative Example 4

The organic electroluminescent device 11 was prepared by repeating the same procedure as in Example 5 except that the naphthacene compound layer 14d was omitted and the thickness of the electron transport layer 14e formed directly on the light-emitting layer 14c was changed to 40 nm.

Results of Evaluation

The organic electroluminescent devices prepared in Examples 5 to 10 and Comparative Example 4 mentioned above were examined for driving voltage (V) at a current density of 10 mA/cm² and color coordinate (x, y) in the same way as in Examples 1 to 4 and Comparative Examples 1 to 3. They were also examined for half-time for brightness in the case of driving with a constant current at a current density of 100 mA/cm². The results are shown in Table 8.

TABLE 8

|  | Naphthacene compound | Thickness of naphthacene compound layer 14d | Voltage (V) | Color coordinate (x, y) | Half-time for brightness (hr) |
|---|---|---|---|---|---|
| Example 5 | 105 | 1 nm | 7.5 | (0.24, 0.67) | 480 |
| Example 6 | 105 | 5 nm | 7.6 | (0.24, 0.67) | 430 |
| Example 7 | 106 | 1 nm | 7.6 | (0.24, 0.67) | 360 |
| Example 8 | 106 | 5 nm | 7.7 | (0.24, 0.67) | 320 |
| Example 9 | 107 | 1 nm | 7.5 | (0.24, 0.67) | 320 |
| Example 10 | 107 | 5 nm | 7.7 | (0.24, 0.67) | 300 |
| Comparative Example 4 | None | None (Alq₃ 40 nm) | 7.5 | (0.24, 0.67) | 240 |

It is noted from Table 8 that the organic electroluminescent devices for green light in Examples 5 to 10 have a much longer life at the same driving voltage than the one in Comparative Example 4 which does not have the naphthacene compound layer 14d.

It is concluded from the foregoing that the organic electroluminescent device 11 according to an embodiment of the present invention, which has the naphthacene compound layer 14d interposed between the electron transport layer 14e and the light-emitting layer 14c, enjoys long-lasting brightness owing to good charge balance for recombination.

Examples 11 to 14 and Comparative Example 5

Figure 4A:
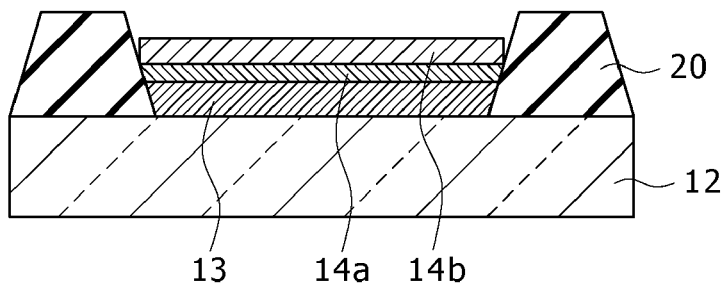
FIGS. 4A to 4C are schematic diagrams showing the process for producing by laser transfer technology the organic electroluminescent device according to an embodiment of the present invention.
Figure 4B:
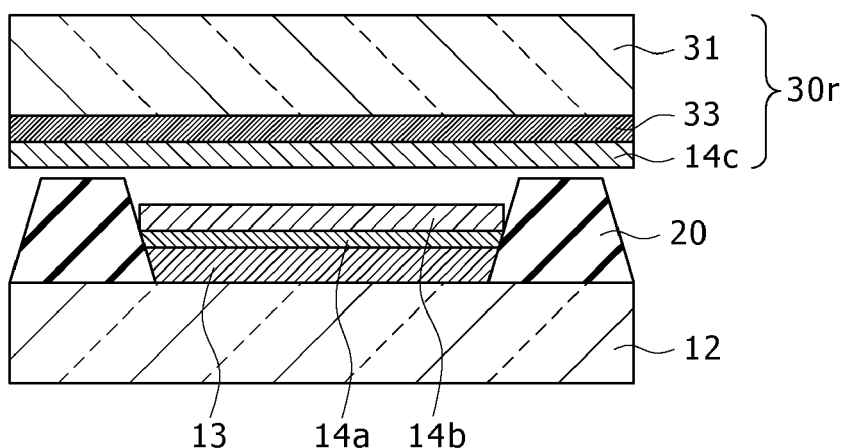
Figure 4C:
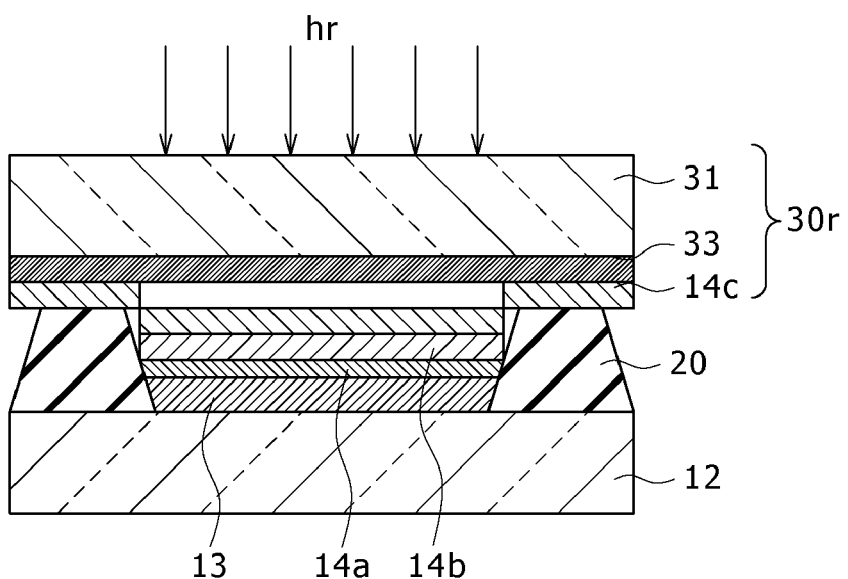

These examples demonstrate the method for producing the organic electroluminescent device by laser transfer as schematically shown in FIGS. 4A to 4C.

In Examples 11 to 14 and Comparative Example 5, the cell for the organic electroluminescent device of top emission type was prepared in the same way as in Examples 5 and 6. On the substrate 12 for the device was formed the anode 13. The insulating film 20 was formed by patterning such that it covers the periphery of the anode 13, leaving the pixel region open. On the anode 13 were sequentially formed the hole injection layer 14a and the hole transport layer 14b by vacuum deposition as shown in FIG. 4A.

The substrate 30r for transfer was prepared in the following manner. The glass substrate 31 was coated by ordinary sputtering with the light-absorbing layer 33 of chromium (200 nm thick). The light-absorbing layer 33 was coated by vacuum deposition with the light-emitting layer 14c (30 nm thick) of 9-(1-naphthyl)-10-(1-biphenyl)anthracene (ANB), represented by the structural formula (A) above, as the host material. ANB was doped with the green dopant represented by the structural formula (B) above. The amount of the dopant was 9% in terms of the thickness ratio.

The thus obtained substrate 30r for transfer was placed on the substrate 12 for the device in such a way that the hole transport layer 14b and the light-emitting layer 14c face each other as shown in FIG. 4B, and they were tightly glued together in a vacuum. There was a small gap (about 2 μm, varying depending on the thickness of the insulating layer 20) between the substrate 30r for transfer and the hole transport layer 14b. The reverse side of the substrate 30r for transfer was irradiated with a laser beam (hr) having a wavelength of 800 nm as shown in FIG. 4C, so that the energy of the laser beams was absorbed by the light-absorbing layer 33. The absorbed energy (or heat) was used to transfer the light-emitting layer 14c from the substrate 30r for transfer onto the hole transport layer 14b.

The laser beam hr has a spot size of 300×10 μm and an energy density of $2.6 \, e^{-3}$ mJ/μm$^2$. It was scanned in the direction perpendicular to the long side of its spot.

The thus formed light-emitting layer 14c was coated by vacuum deposition with the auxiliary light-emitting layer (30 nm thick), which contains as the host material 9,10-di(2-naphthyl)anthracene (ADN) represented by the structural formula A-20 in Table 2. The (ADN) was doped with BD-052 (made by Idemitsu Kosan Co., Ltd.) as a blue dopant. The amount of the dopant was 5% in terms of the thickness ratio. The auxiliary light-emitting layer is not shown.

The thus formed auxiliary light-emitting layer was coated by vacuum deposition with the naphthacene compound layer 14d of the compound (105) mentioned above. The thickness of the naphthacene compound layer 14d in Examples 11 to 14 was 1 nm, 3 nm, 5 nm, and 10 nm, respectively.

Then, the electron transport layer 14e (39 nm thick) was formed by vacuum deposition from Alq$_3$ (8-hydroxyquinoline aluminum). The thickness of the electron transport layer 14e was established such that the total thickness of the naphthacene compound layer 14d and the electron transport layer 14e was 40 nm. Thus, the thickness of the electron transport layer 14e in Examples 11 to 14 was 39 nm, 37 nm, 35 nm, and 30 nm, respectively. In Comparative Example 5, the naphthacene compound layer 14d was omitted and the electron transport layer 14e (40 nm thick) was formed by vacuum deposition.

Thus there was obtained the organic layer 14 including the hole injection layer 14a, the hole transport layer 14b, the light-emitting layer 14c, the naphthacene compound layer 14d, the auxiliary light-emitting layer (not shown), and the electron transport layer 14e, which are sequentially arranged one over another. Subsequently, the first layer 15a (about 0.5 nm thick) of the cathode 15 was formed from LiF by vacuum deposition at a rate of 0.01 nm/sec. Finally, on the first layer 15a was formed the second layer 15b (11 nm thick) of the cathode 15 from MgAg by vacuum deposition. Thus there was obtained the organic electroluminescent device 11.

Results of Evaluation

The organic electroluminescent devices prepared in Examples 11 to 14 and Comparative Example 5 mentioned above were examined for the color coordinate (x, y) when driven at a current density of 10 mA/cm$^2$, the light emission efficiency (cd/A) when driven at a current density of 10 MA/cm$^2$, and the half-time for brightness in the case of driving with a constant current at a current density of 100 mA/cm$^2$. The results are shown in Table 9.

TABLE 9

|  | Naphthacene compound | Thickness of naphthacene compound layer 14d | Light emission efficiency (cd/A) | Color coordinate (x, y) | Half-time for brightness (hr) |
| --- | --- | --- | --- | --- | --- |
| Example 11 | 105 | 1 nm | 17.7 | (0.24, 0.67) | 1340 |
| Example 12 | 105 | 3 nm | 20.0 | (0.24, 0.67) | 1380 |
| Example 13 | 105 | 5 nm | 20.6 | (0.24, 0.67) | 1410 |
| Example 14 | 105 | 10 nm | 18.9 | (0.21, 0.67) | 1380 |
| Comparative Example 5 | None | None (Alq$_3$ 40 nm) | 18.9 | (0.24, 0.67) | 340 |

It is noted from Table 9 that the organic electroluminescent devices for green light emission in Examples 11 to 14 have a much longer life at the same driving voltage than that in Comparative Example 5 which does not have the naphthacene compound layer.

It is concluded from the foregoing that the organic electroluminescent device according to an embodiment of the present invention, which has the naphthacene compound layer interposed between the electron transport layer and the light-emitting layer, enjoys long-lasting brightness owing to good charge balance for recombination.

The present application contains subject matter related to that disclosed in Japanese Priority Patent Application JP 2008-129592 filed in the Japan Patent Office on May 16, 2008, the entire content of which is hereby incorporated by reference.

It should be understood by those skilled in the art that various modifications, combinations, sub-combinations and alterations may occur depending on design requirements and other factor in so far as they are within the scope of the appended claims or the equivalents thereof.

What is claimed is:

1. An organic electroluminescent device comprising:
    an anode;
    a cathode; and
    an organic layer held between them which includes
        a light-emitting layer,
        a naphthacene compound layer containing a naphthacene compound, and
        an electron transport layer;
        said light-emitting layer being composed of a light-emitting guest material and an aromatic hydrocarbon compound having the skeleton of anthracene, and
        said naphthacene compound layer containing no less than 80 wt % of naphthacene compound represented by the formula (1) below and having a thickness of 0.5 to 10 nm and being in contact with that side of said electron transport layer which faces said light-emitting layer

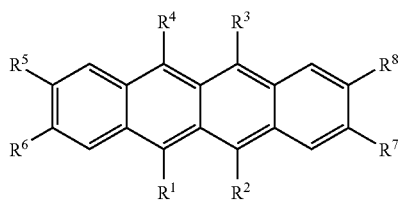
(1)

where, $R^1$ to $R^8$ independently denote a hydrogen atom, halogen atom, hydroxyl group, cyano group, nitro group, any of carbonyl group, carbonyl ester group, alkyl group, alkenyl group, and alkoxyl group, which may be substituted with a group having no more than 20 carbon atoms, and any of silyl group, aryl group, and heterocyclic group, which may be substituted with a group having no more than 30 carbon atoms.

2. The organic electroluminescent device as defined in claim 1, wherein the naphthacene compound layer contains no less than 80 wt % of naphthacene compound represented by the formula (2) below

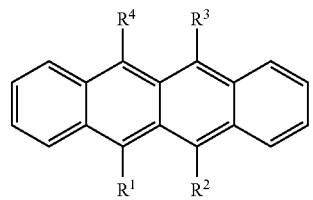
(2)

where, $R^1$ to $R^4$ independently denote any of hydrogen atom, substituted or unsubstituted phenyl group, substituted or unsubstituted biphenyl group, substituted or unsubstituted naphthyl group, heterocyclic group, phenyl-substituted heterocyclic group, and condensed polycyclic aromatic heterocyclic group having no more than 13 carbon atoms.

3. The organic electroluminescent device as defined in claim 2, wherein $R^1$ to $R^4$ in the formula (2) for the naphthacene compound layer independently denote any of hydrogen atom, substituted or unsubstituted phenyl group, substituted or unsubstituted biphenyl group, and substituted or unsubstituted naphthyl group.

4. The organic electroluminescent device as defined in claim 1, wherein the naphthacene compound layer has a thickness of 1 to 5 nm.

5. The organic electroluminescent device as defined in claim 1, which has an auxiliary light-emitting layer formed between the light-emitting layer and the naphthacene compound layer.

6. The organic electroluminescent device as defined in claim 1, the light-emitting guest material is an organic material that emits blue or green light.

7. The organic electroluminescent device as defined in claim 1, wherein the light generated by the light-emitting layer experiences multiple interference between any layers held between the anode and cathode and then emanates from either the anode or the cathode.

8. The organic electroluminescent device as defined in claim 1, wherein the light generated by the light-emitting layer experiences multiple interference between any layers held between the anode and cathode and then emanates from the cathode.

9. A display unit comprising:
    a substrate; and
    an array of organic electroluminescent devices arranged thereon, with at least a portion of said organic electroluminescent devices being the one which includes
        an anode,
        a cathode, and
        an organic layer held between them which includes
        a light-emitting layer,
        a naphthacene compound layer containing a naphthacene compound, and
        an electron transport layer;
        said light-emitting layer being composed of a light-emitting guest material and an aromatic hydrocarbon compound having the skeleton of anthracene, and
        said naphthacene compound layer containing no less than 80 wt % of naphthacene compound represented by the formula (1) below and having a thickness of 0.5 to 10 nm and being in contact with that side of said electron transport layer which faces said light-emitting layer

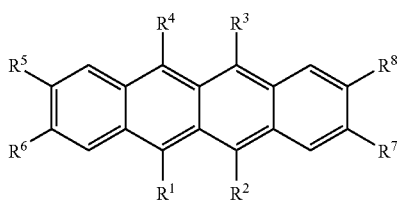

(1)

where, $R^1$ to $R^8$ independently denote a hydrogen atom, halogen atom, hydroxyl group, cyano group, nitro group, any of carbonyl group, carbonyl ester group, alkyl group, alkenyl group, and alkoxyl group, which may be substituted with a group having no more than 20 carbon atoms, and any of silyl group, aryl group, and heterocyclic group, which may be substituted with a group having no more than 30 carbon atoms.

10. The display unit as defined in claim 9, wherein at least a portion of the organic electroluminescent devices are blue light-emitting ones.

11. The display unit as defined in claim 9, wherein at least a portion of the organic electroluminescent devices are green light-emitting ones.

12. The display unit as defined in claim 9, wherein the substrate has organic electroluminescent devices emitting blue, green, and red light arranged thereon, and said organic electroluminescent devices emitting blue light and/or said organic electroluminescent devices emitting green light constitute at least a portion of said organic electroluminescent devices.

* * * * *